United States Patent
Dunga et al.

(10) Patent No.: US 9,564,226 B1
(45) Date of Patent: Feb. 7, 2017

(54) SMART VERIFY FOR PROGRAMMING NON-VOLATILE MEMORY

(71) Applicant: SanDisk Technologies Inc., Plano, TX (US)

(72) Inventors: Mohan Dunga, Santa Clara, CA (US); Gerrit Jan Hemink, San Ramon, CA (US); Zhenming Zhou, San Jose, CA (US); Masaaki Higashitani, Cupertino, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/928,436

(22) Filed: Oct. 30, 2015

(51) Int. Cl.
  *G11C 11/34* (2006.01)
  *G11C 16/10* (2006.01)
  *G11C 16/34* (2006.01)

(52) U.S. Cl.
  CPC ........... *G11C 16/10* (2013.01); *G11C 16/3459* (2013.01)

(58) Field of Classification Search
  CPC ........................... G11C 16/10; G11C 16/3459
  See application file for complete search history.

(56) References Cited

U.S. PATENT DOCUMENTS

| | | | |
|---|---|---|---|
| 7,073,103 B2 | 7/2006 | Gongwer et al. | |
| 7,447,081 B2 | 11/2008 | Chan | |
| 7,564,715 B2 | 7/2009 | Mokhlesi | |
| 7,570,520 B2 | 8/2009 | Kamei et al. | |
| 7,894,273 B2 | 2/2011 | Li et al. | |
| 7,969,786 B2 | 6/2011 | Wang | |
| 8,018,769 B2 | 9/2011 | Tu et al. | |
| 8,130,551 B2 | 3/2012 | Oowada et al. | |
| 8,174,883 B2 | 5/2012 | Honma et al. | |
| 8,363,479 B2 | 1/2013 | Honma | |
| 8,539,138 B2 | 9/2013 | Kim et al. | |

(Continued)

FOREIGN PATENT DOCUMENTS

| WO | WO2007/050976 A1 | 5/2007 |
|---|---|---|
| WO | WO2009/158350 A1 | 12/2009 |

OTHER PUBLICATIONS

U.S. Appl. No. 14/619,875, filed Feb. 11, 2015.

(Continued)

*Primary Examiner* — Richard Elms
*Assistant Examiner* — Mohammed A Bashar
(74) *Attorney, Agent, or Firm* — Vierra Magen Marcus LLP

(57) ABSTRACT

Techniques are provided for reducing current consumption while programming non-volatile storage. A smart verify is performed using a subset of memory cells. By applying the smart verify to just a subset of the memory cells current is saved. The smart verify may be used to characterize programming speed. Results of the smart verify may be used to determine a magnitude of a dummy program pulse to be applied later in the programming process. The dummy program pulse is not followed by a program verify, which reduces current. If the dummy program pulse pushes threshold voltages high enough, then those memory cells will not conduct a current when verifying later in programming. Thus, current is saved during the program verify. Also, bit lines of memory cells that received the dummy pulses do not need to be pre-charged prior to a program pulse, which can save more current.

20 Claims, 23 Drawing Sheets

(56) References Cited

U.S. PATENT DOCUMENTS

| | | | |
|---|---|---|---|
| 9,142,302 B2 | 9/2015 | Dong et al. | |
| 9,269,446 B1* | 2/2016 | Magia | G11C 16/10 |
| 9,349,460 B2 | 5/2016 | Komatsu | |
| 2008/0062768 A1 | 3/2008 | Li et al. | |
| 2013/0070530 A1* | 3/2013 | Chen | G11C 5/063 |
| | | | 365/185.11 |
| 2013/0235657 A1 | 9/2013 | Honma | |
| 2014/0226406 A1 | 8/2014 | Dong et al. | |
| 2014/0247667 A1* | 9/2014 | Dutta | G11C 16/14 |
| | | | 365/185.22 |
| 2014/0293698 A1 | 10/2014 | Beltrami et al. | |

OTHER PUBLICATIONS

International Search Report & The Written Opinion of the International Searching Authority dated Nov. 28, 2016, International Application No. PCT/US2016/051452.

\* cited by examiner

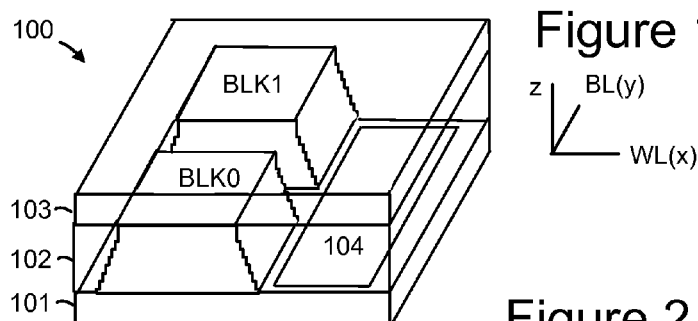
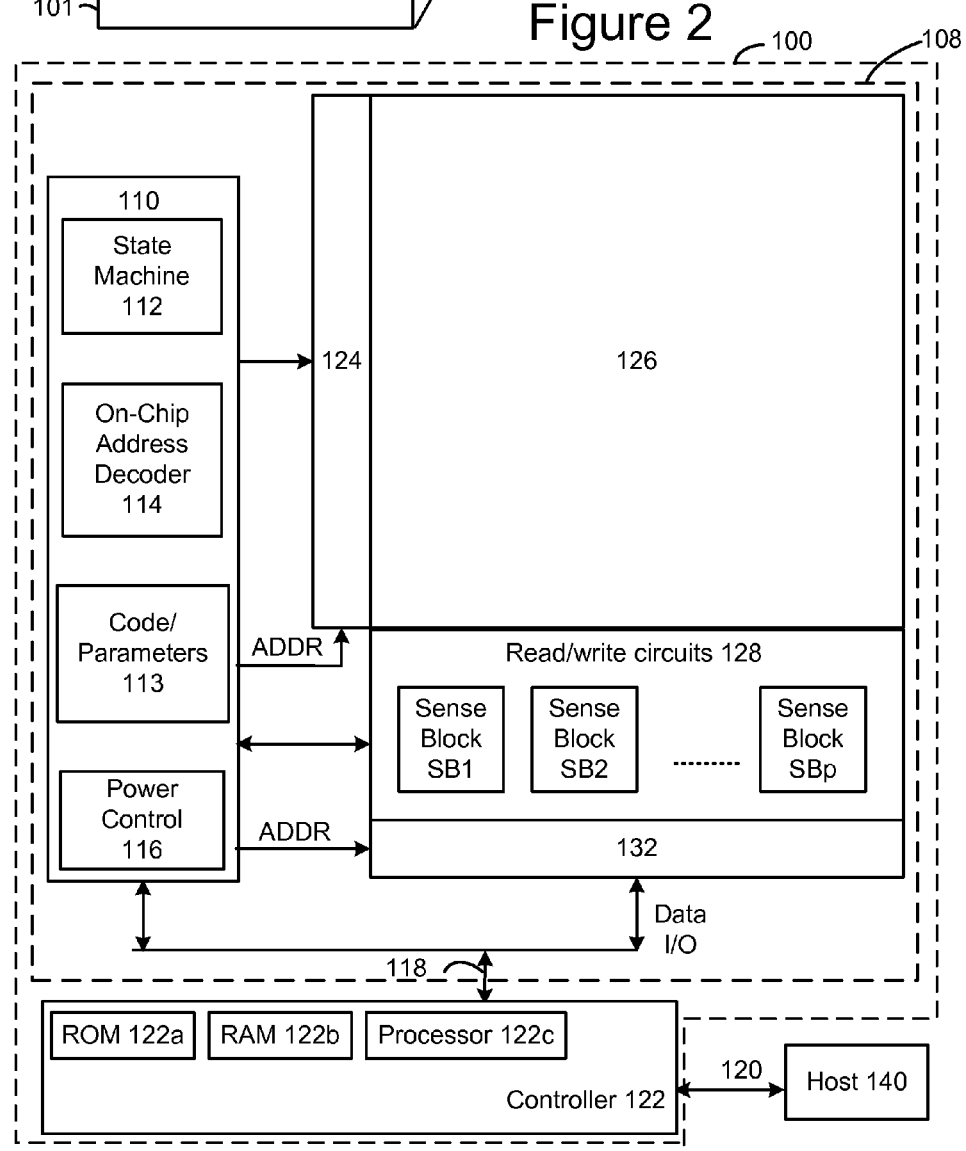

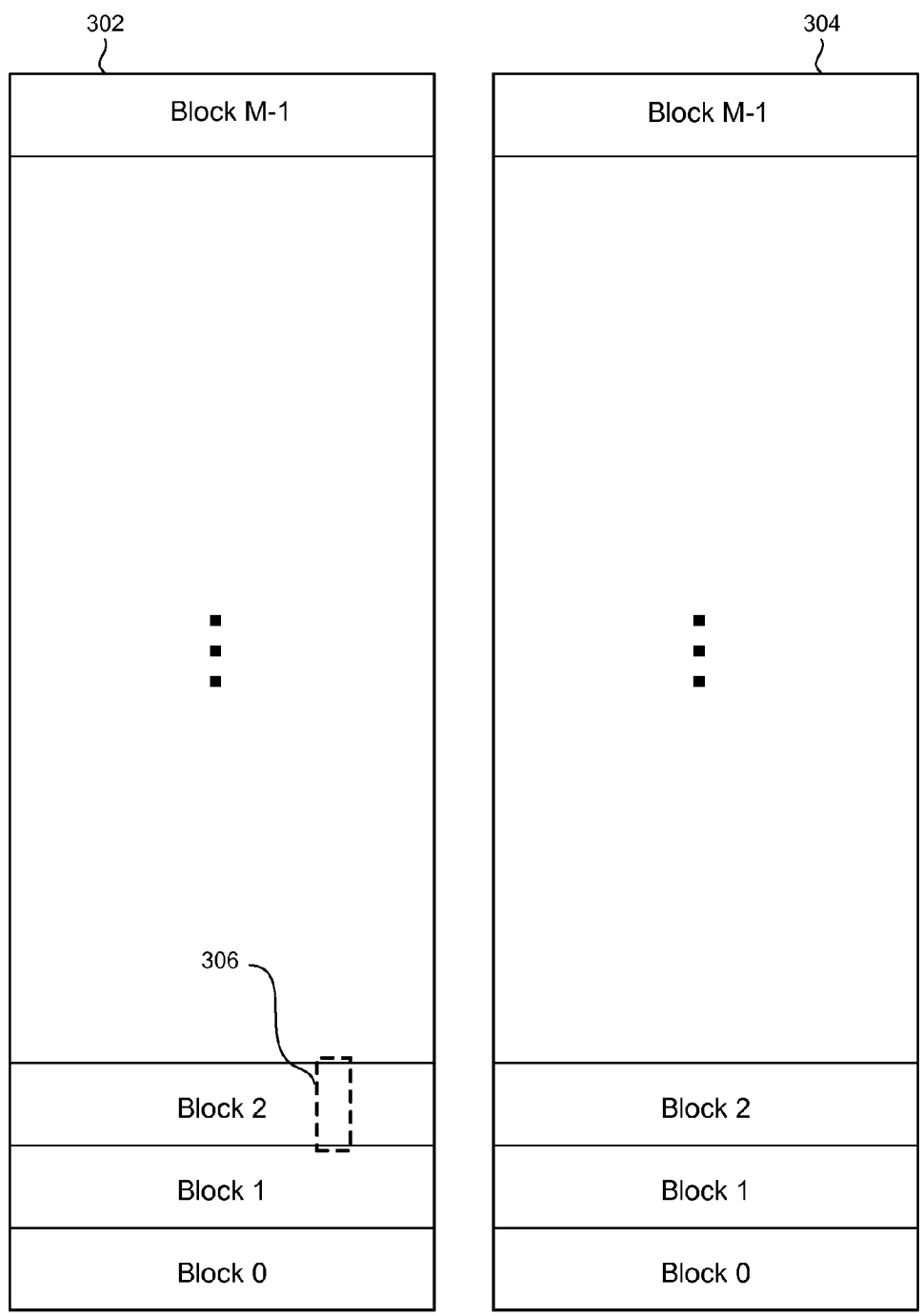

Figure 4C
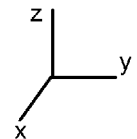
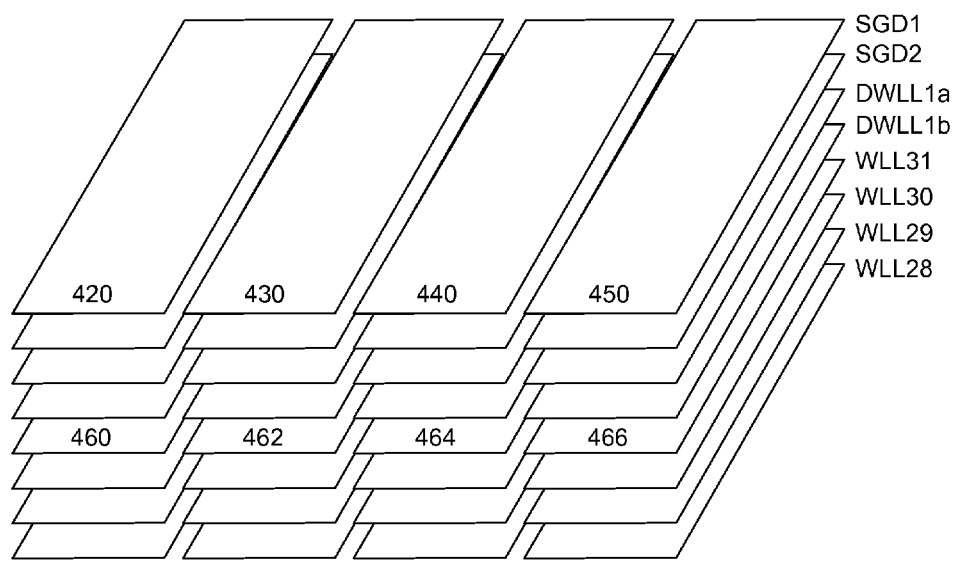
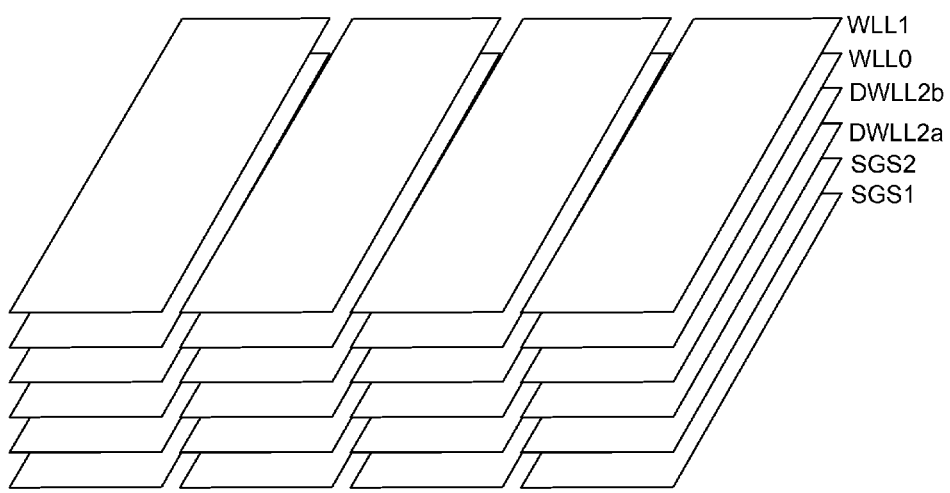

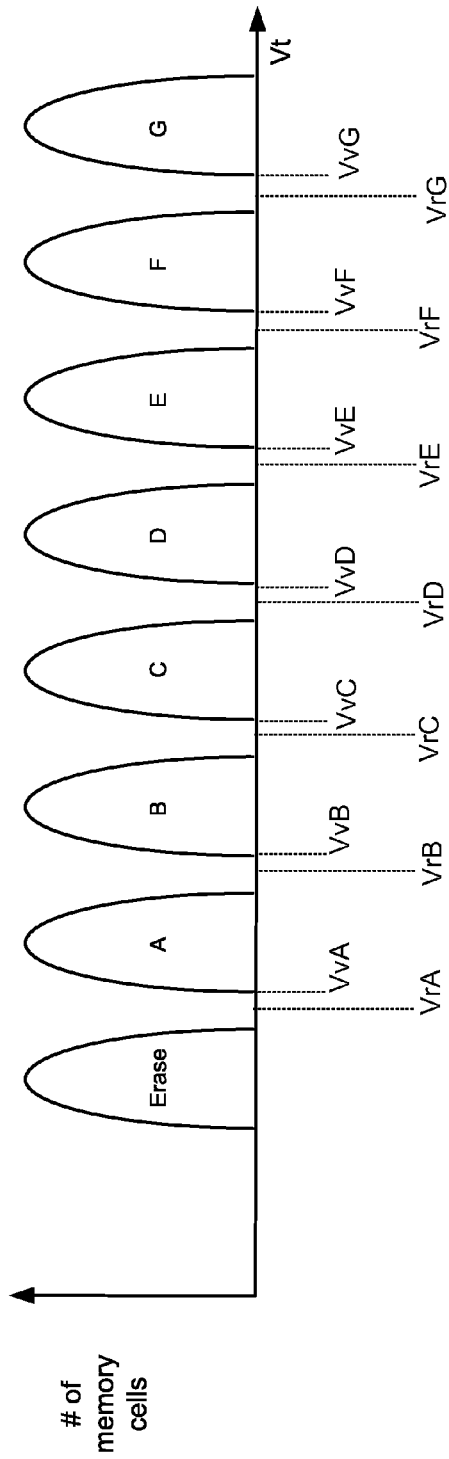
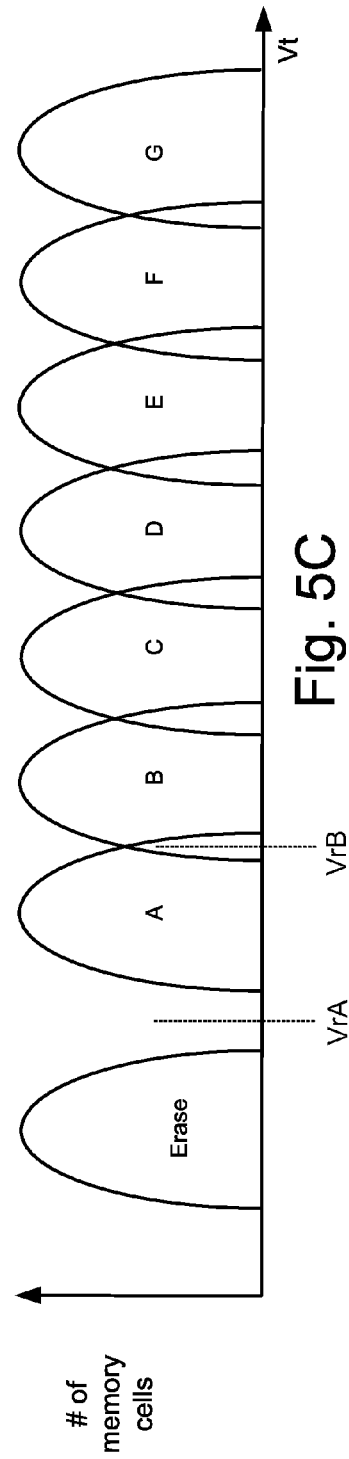
Fig. 5B
Fig. 5C

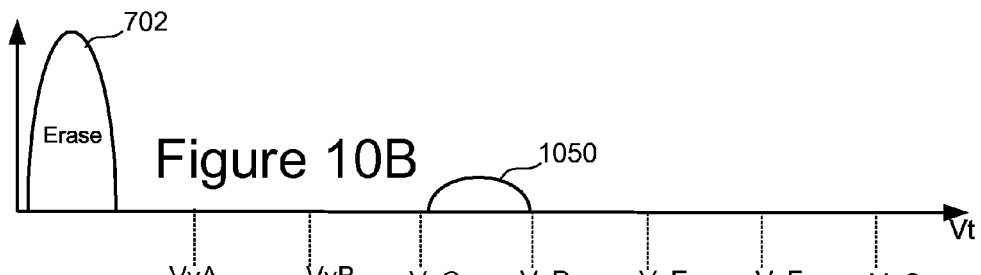
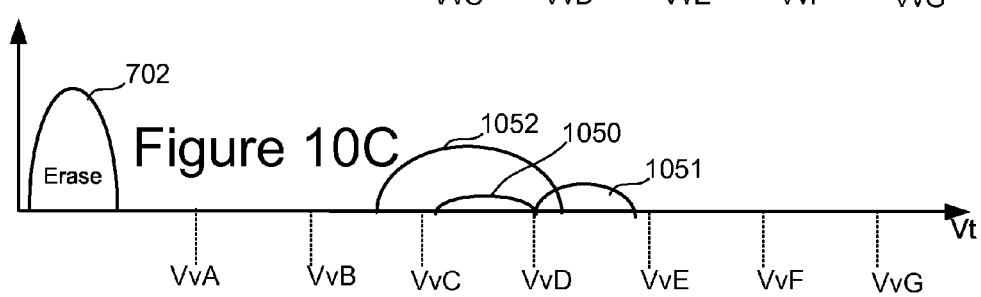
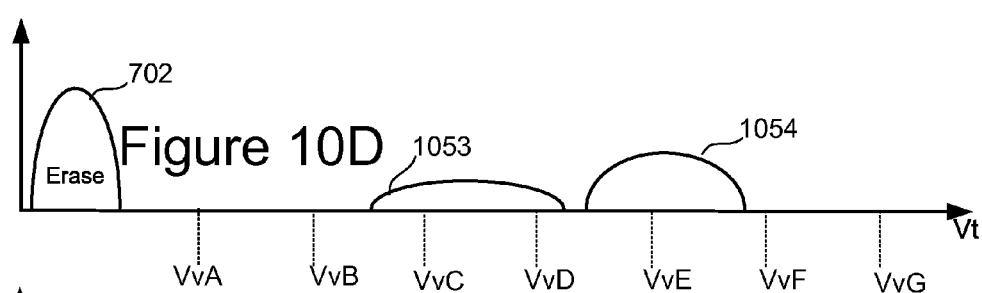
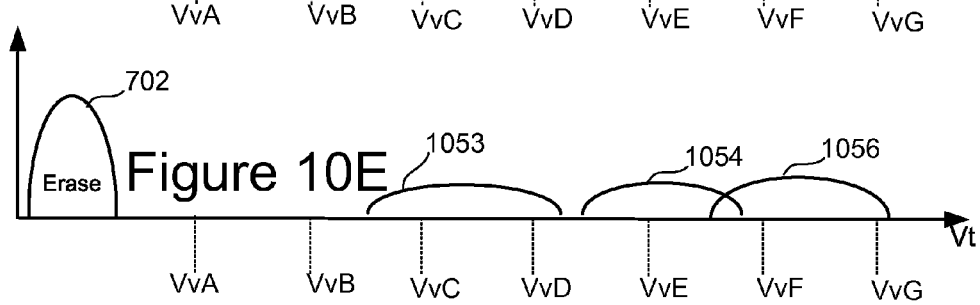
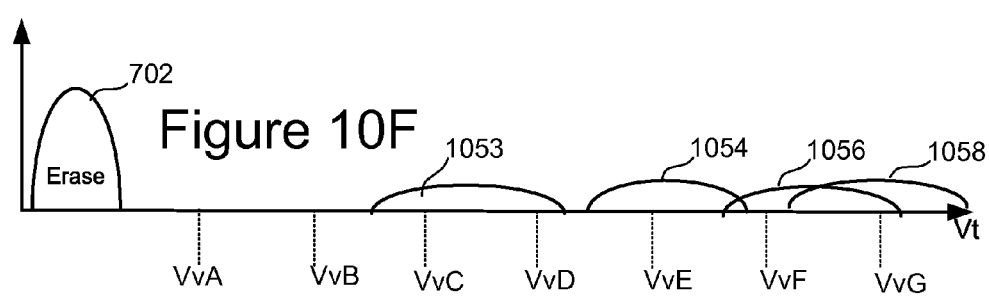

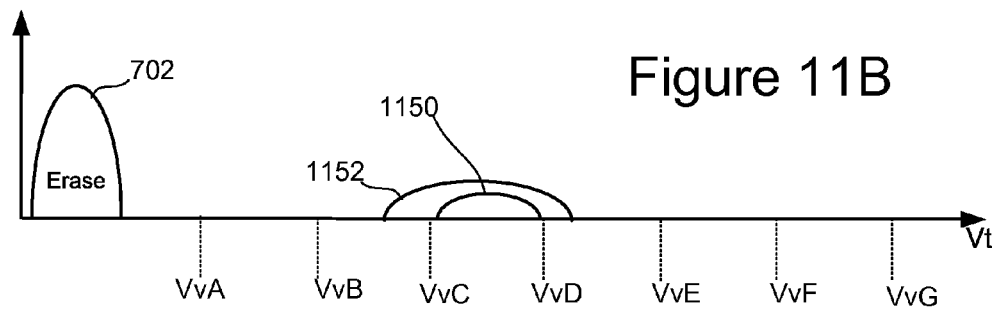
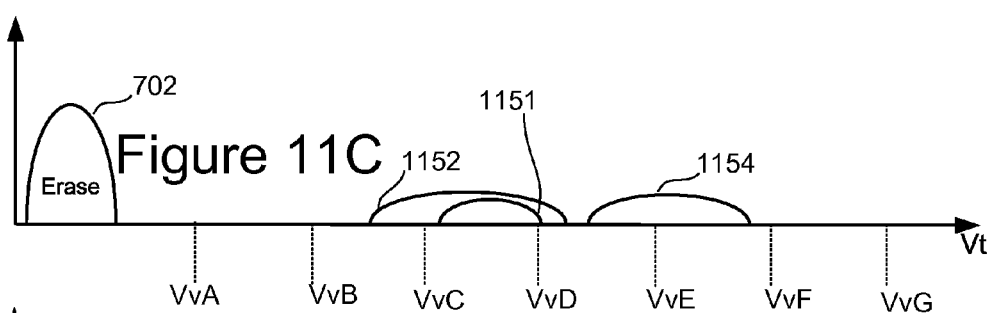
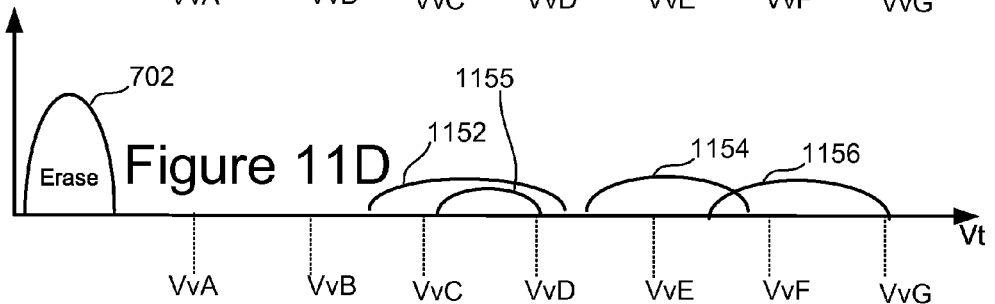
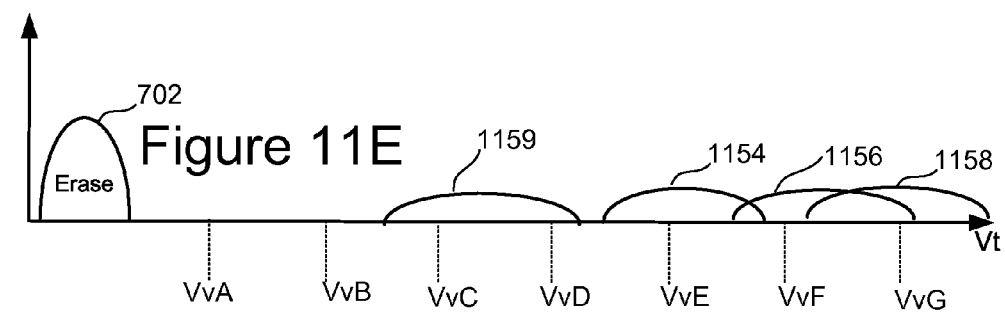

SMART VERIFY FOR PROGRAMMING NON-VOLATILE MEMORY

BACKGROUND

The present disclosure relates to technology for non-volatile storage.

Semiconductor memory is used in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Some non-volatile memory store information in a charge storage region that is insulated from a channel region in a semiconductor substrate. As one example, a floating gate is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

Some non-volatile memory utilizes a charge trapping layer to store information. One such example has an oxide-nitride-oxide (ONO) region, in which the nitride (e.g., SiN) serves as a charge trapping layer to store information. When such a memory cell is programmed, electrons are stored in the charge trapping layer.

Non-volatile memory could have a 2D architecture or a 3D architecture. Recently, ultra-high density storage devices have been proposed using a 3D stacked memory structure having strings of memory cells. One such storage device is sometimes referred to as a Bit Cost Scalable (BiCS) architecture. For example, a 3D NAND stacked memory device can be formed from an array of alternating conductor and insulator layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a pipe connection. Control gates of the memory cells are provided by the conductor layers.

Prior to programming certain non-volatile memory devices, such as a NAND flash memory device, the memory cells are erased. The erase operation removes electrons from the floating gate, for some devices. For some devices, the erase operation removes electrons from the charge trapping layer. Thus, the erase may lower the threshold voltage of the memory cell.

Programming of the memory cells may be achieved by applying a program voltage to the control gate to raise the threshold voltage of the memory cell. Typically, a sensing operation, referred to as program verify, is performed after the program voltage is applied in order to determine whether the memory cell has reached its intended threshold voltage. This process can be repeating in a number of program loops. Memory cells can be locked out from further programming after they reach their target threshold voltage to prevent over-programming.

BRIEF DESCRIPTION OF THE DRAWINGS

Like-numbered elements refer to common components in the different figures.

FIG. 1 is a perspective view of a 3D stacked non-volatile memory device.

FIG. 2 is a functional block diagram of a memory device such as the 3D stacked non-volatile memory device of FIG. 1.

FIG. 3 is a block diagram of a memory structure having two planes.

FIG. 4C depicts a view of the select gate layers and word line layers.

FIG. 5B illustrates example $V_T$ distributions corresponding to data states for the memory cell array when each memory cell stores three bits of data.

FIG. 5C illustrates that $V_T$ distributions can partially overlap.

FIG. 10B depicts $V_T$ distributions prior to one embodiment of process 1000 of FIG. 10A.

FIGS. 10C-10F depicts $V_T$ distributions during one embodiment of process 1000 of FIG. 10A.

FIGS. 11B-11E depict $V_T$ distributions during one embodiment of process 1100 of FIG. 11A.

DETAILED DESCRIPTION

Figure 4A:
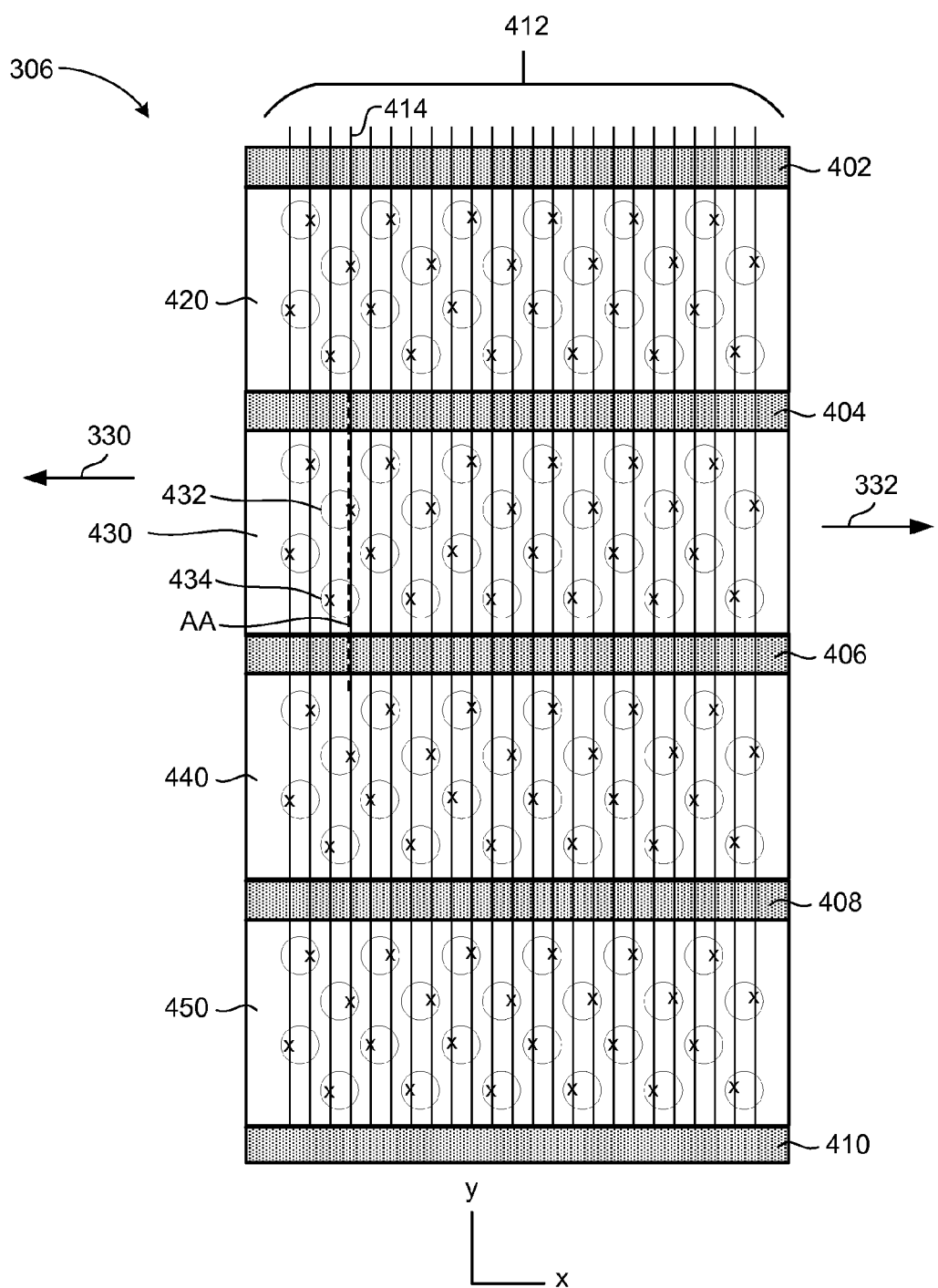
FIG. 4A depicts a top view of a portion of a block of memory cells.

Techniques are provided for programming non-volatile storage. In general, programming may consume considerable current. A considerable portion of the current may be consumed during the program verify operation. One reason for this current consumption is that memory cells that do not pass program verify turn on and conduct a current because their threshold voltage is not yet high enough to pass program verify. Techniques disclosed herein reduce the amount of current used during the program verify operation. Considerable current may also be consumed setting up conditions for programming. Techniques disclosed herein reduce the amount of current used when setting up conditions for programming.

In one embodiment, a smart verify is performed using only a subset of memory cells that are to be programmed. By applying the smart verify to just a subset of the memory cells current is saved. The smart verify applies a program pulse to memory cells, and then senses the subset, in one embodiment. In one embodiment, memory cells in the group to be programmed that do not take part in the smart verify are locked out during smart verify such that their threshold voltages are not affected by the program pulse. Also, they may be locked out during the sensing in order to save current. One factor for reducing the current is not having to pre-charge bit lines. Another factor for reducing current is that those memory cells will not conduct a current during the sensing operation because they are locked out.

The smart verify may be used to characterize the programming of the memory cells. For example, the smart verify may provide information to determine how fast the memory cells program. In one embodiment, the smart verify is used to determine a magnitude of a dummy program pulse to be applied later in the process of programming the memory cells. The dummy program pulse is not followed by a program verify, which reduces current consumption. The dummy program pulse may be used to move the threshold voltage of selected memory cells to higher voltage prior to applying another program pulse that is followed by program verify. This can reduce current for the following reasons. If the dummy program pulse pushes threshold voltages high enough, then those memory cells will not conduct a current when verifying. Thus, current is reduced during the program verify. A variety of techniques are discussed for applying dummy program pulses.

In some embodiments, techniques disclosed herein are applied in a 3D stacked non-volatile memory device. The following is one example of a 3D stacked non-volatile memory device. Embodiments disclosed herein are not limited to this 3D example. Embodiments disclosed herein are not limited to 3D memory. For example, techniques disclosed herein may also be used in 3D memory, such as but not limited to, 2D NAND. Embodiments are not limited to NAND.

The following discussion provides details of one example of a suitable structure for a memory devices that can implement the proposed technology. FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

FIG. 2 is a functional block diagram of an example memory device such as the 3D stacked non-volatile memory device 100 of FIG. 1. Memory device 100 includes one or more memory die 108. Each memory die 108 includes a three-dimensional memory structure 126 of memory cells (such as, for example, a 3D array of memory cells), control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separated from the memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electronic circuits).

The on-chip address decoder 114 provides an address interface between addresses used by host 140 or memory controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, storage 113, power control module 116, sense blocks SB1, SB2, . . . , SBp, read/write circuits 128, and controller 122 can be considered a managing circuit that performs the functions described herein.

The (on-chip or off-chip) controller 122 may comprise a processor 122c and storage devices (memory) such as ROM 122a and RAM 122b. The storage devices comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that this technology is not limited to a single specific memory structure, but covers many relevant memory structures within the spirit and scope of the technology as described herein and as understood by one of ordinary skill in the art.

FIG. 3 is a block diagram explaining one example organization of memory structure 126, which is divided into two planes 302 and 304. Each plane is then divided into M blocks. In one example, each plane has about 2000 blocks. However, different numbers of blocks and planes can also be used.

FIG. 4A is a block diagram depicting a top view of a portion of one block from memory structure 126. The portion of the block depicted in FIG. 4A corresponds to portion 306 in block 2 of FIG. 4A. As can be seen from FIG. 4A, the block depicted in FIG. 4A extends in the direction of arrow 330 and in the direction of arrow 332. In one embodiment, the memory array will have 48 layers. Other embodiments have less than or more than 48 layers. However, FIG. 4A only shows the top layer.

FIG. 4A depicts a plurality of circles that represent the vertical columns. Each of the vertical columns include multiple select transistors and multiple memory cells. In one embodiment, each vertical column implements a NAND string. More details of the vertical columns are provided below. Since the block depicted in FIG. 4A extends in the direction of arrow 330 and in the direction of arrow 332, the block includes more vertical columns than depicted in FIG. 4A.

FIG. 4A also depicts a set of bit lines 412. FIG. 4A shows twenty four bit lines because only a portion of the block is depicted. It is contemplated that more than twenty four bit lines connected to vertical columns of the block. Each of the circles representing vertical columns has an "x" to indicate its connection to one bit line.

The block depicted in FIG. 4A includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4A is divided into regions 420, 430, 440 and 450. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the managing circuit uses the source side select lines and the drain side select lines to choose one (or another subset) of the four to be subjected to a memory operation (program, verify, read, and/or erase).

Although FIG. 4A shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4A also shows the vertical columns being staggered. In other embodiments, different patterns of staggering can be used. In some embodiments, the vertical columns are not staggered.

Figure 4B:
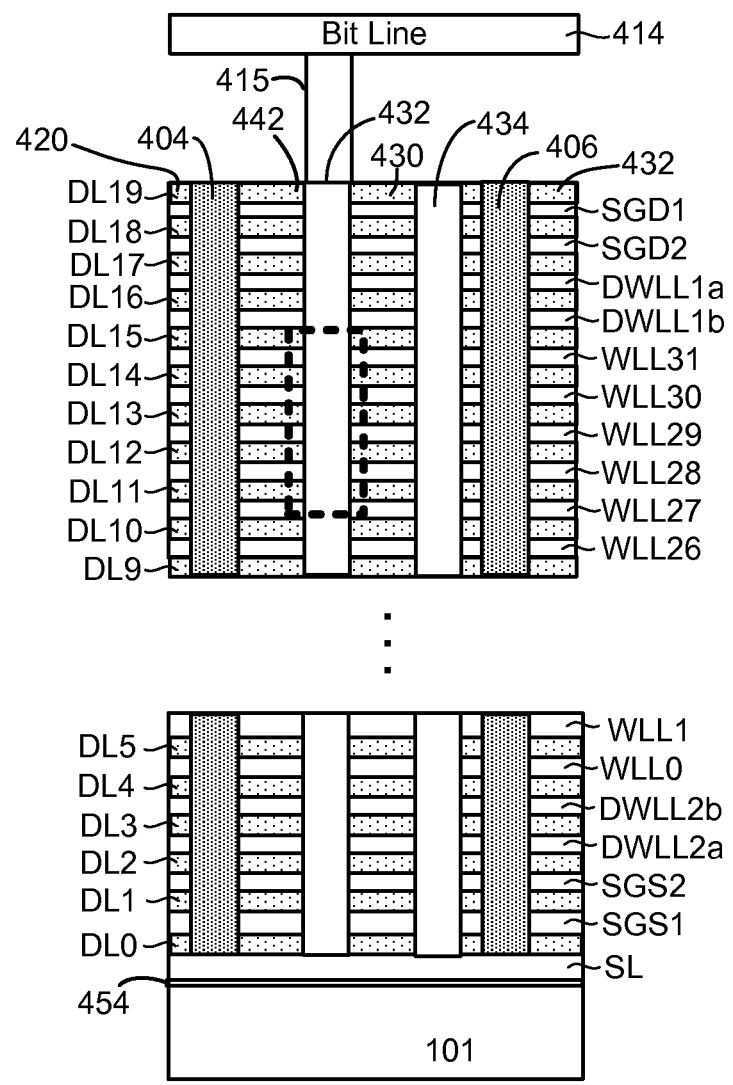
FIG. 4B depicts a cross sectional view of a portion of a block of memory cells.

FIG. 4B depicts a portion of an embodiment of three dimensional memory structure 126 showing a cross-sectional view along line AA of FIG. 4A. This cross sectional view cuts through vertical columns 432 and 434 and region 430 (see FIG. 4A). The structure of FIG. 4B includes two drain side select layers SGD1 and SGD1; two source side select layers SGS1 and SGS2; four dummy word line layers DWLL1a, DWLL1b, DWLL2a and DWLL2b; and thirty two word line layers WLL0-WLL31 for connecting to data memory cells. Other embodiments can implement more or less than two drain side select layers, more or less than two source side select layers, more or less than four dummy word line layers, and more or less than thirty two word line layers. Vertical columns 432 and 434 are depicted protruding through the drain side select layers, source side select layers, dummy word line layers and word line layers. In one embodiment, each vertical column comprises a NAND string. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4A, FIG. 4B show vertical column 432 connected to Bit Line 414 via connector 415. Local interconnects 404 and 406 are also depicted.

For ease of reference, drain side select layers SGD1 and SGD1; source side select layers SGS1 and SGS2; dummy word line layers DWLL1a, DWLL1b, DWLL2a and DWLL2b; and word line layers WLL0-WLL31 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL19. For example, dielectric layers DL10 is above word line layer WLL26 and below word line layer WLL27. In one embodiment, the dielectric layers are made from $SiO_2$. In other embodiments, other dielectric materials can be used to form the dielectric layers.

The memory cells are formed along vertical columns which extend through alternating conductive and dielectric layers in the stack. In one embodiment, the memory cells are arranged in NAND strings. The word line layer WLL0-WLL31 connect to memory cells (also called data memory cells). Dummy word line layers DWLL1a, DWLL1b, DWLL2a and DWLL2b connect to dummy memory cells. A dummy memory cell, also referred to as a non-data memory cell, does not store user data, while a data memory cell is eligible to store user data. Thus, data memory cells may be programmed. Drain side select layers SGD1 and SGD1 are used to electrically connect and disconnect NAND strings from bit lines. Source side select layers SGS1 and SGS2 are used to electrically connect and disconnect NAND strings from the source line SL.

FIG. 4C depicts a perspective view of the conductive layers (SGD1, SGD1, SGS1, SGS2; DWLL1a, DWLL1b, DWLL2a, DWLL2b, and WLL0-WLL31) for the block that is partially depicted in FIG. 4C. As mentioned above with respect to FIG. 4A, local interconnects 401, 404, 406, 408 and 410 break up each conductive layers into four regions. For example, drain side select gate layer SGD1 (the top layer) is divided into regions 420, 430, 440 and 450. Similarly, word line layer WLL31 is divided into regions 460, 462, 464 and 466. For word line layers (WLL0-WLL31), the regions are referred to as word line fingers; for example, word line layer WLL31 is divided into word line fingers 460, 462, 464 and 466.

Figure 4D:
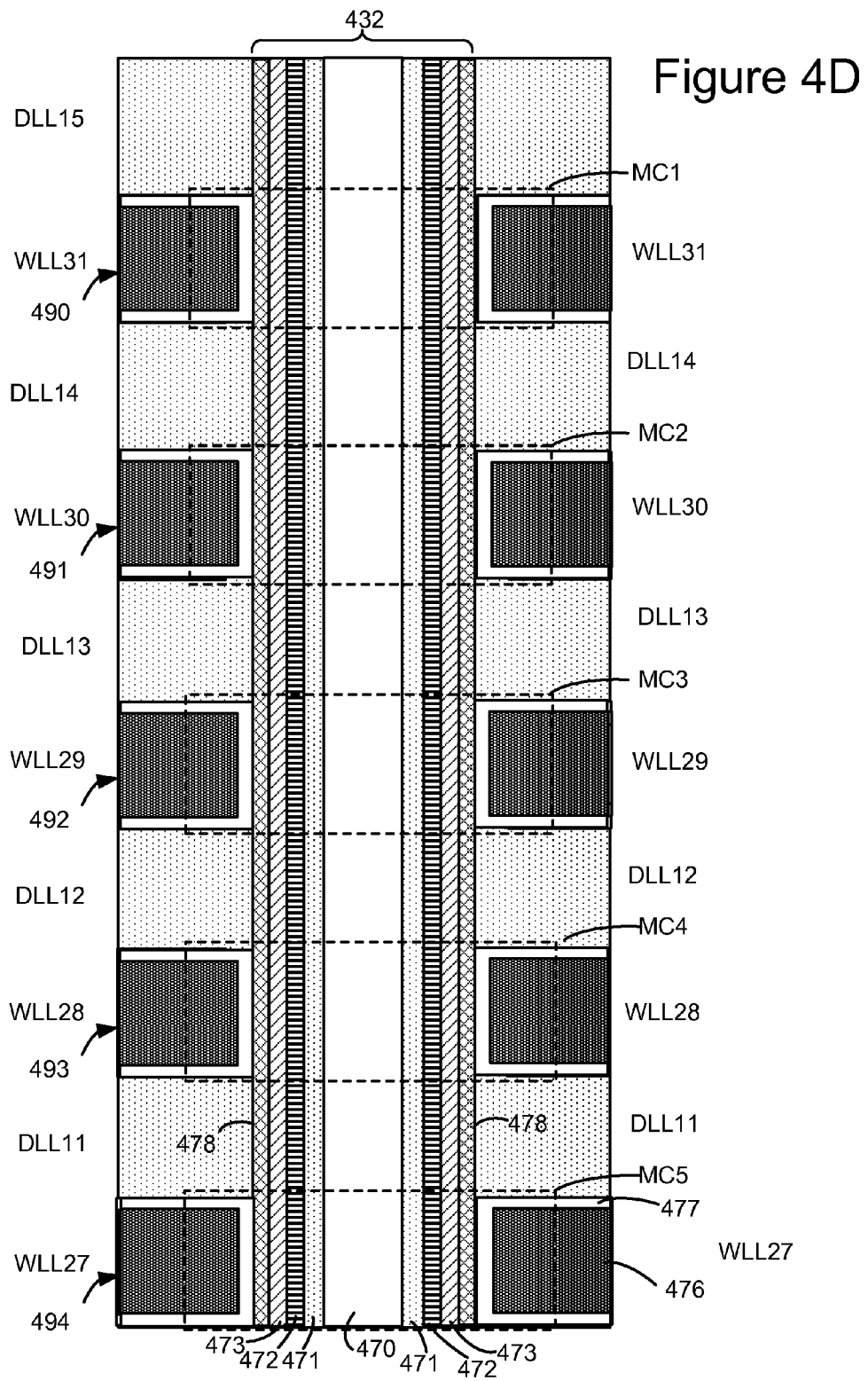
FIG. 4D is a cross sectional view of a vertical column of memory cells.

FIG. 4D depicts a cross sectional view of region 442 of FIG. 4B that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) a specially formulated silicon nitride that increases trap density.

FIG. 4D depicts dielectric layers DLL11, DLL12, DLL13, DLL14 and DLL15, as well as word line layers WLL27, WLL28, WLL29, WLL30, and WLL31. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell comprises channel 471, tunneling dielectric 472, charge trapping layer 473, blocking oxide layer 478, aluminum oxide layer 477 and word line region 476. For example, word line layer WLL31 and a portion of vertical column 432 comprise a memory cell MC1. Word line layer WLL30 and a portion of vertical column 432 comprise a memory cell MC2. Word line layer WLL29 and a portion of vertical column 432 comprise a memory cell MC3. Word line layer WLL28 and a portion of vertical column 432 comprise a memory cell MC4. Word line layer WLL27 and a portion of vertical column 432 comprise a memory cell MC5.

When a memory cell is programmed, electrons are stored in a portion of the charge trapping layer 473 which is associated with the memory cell. These electrons are drawn into the charge trapping layer 473 from the channel 471, through the tunneling layer 473, in response to an appropriate voltage on word line region 476. The threshold voltage ($V_T$) of a memory cell is increased in proportion to the amount of stored charge. During an erase operation, the electrons return to the channel.

Figure 5A:
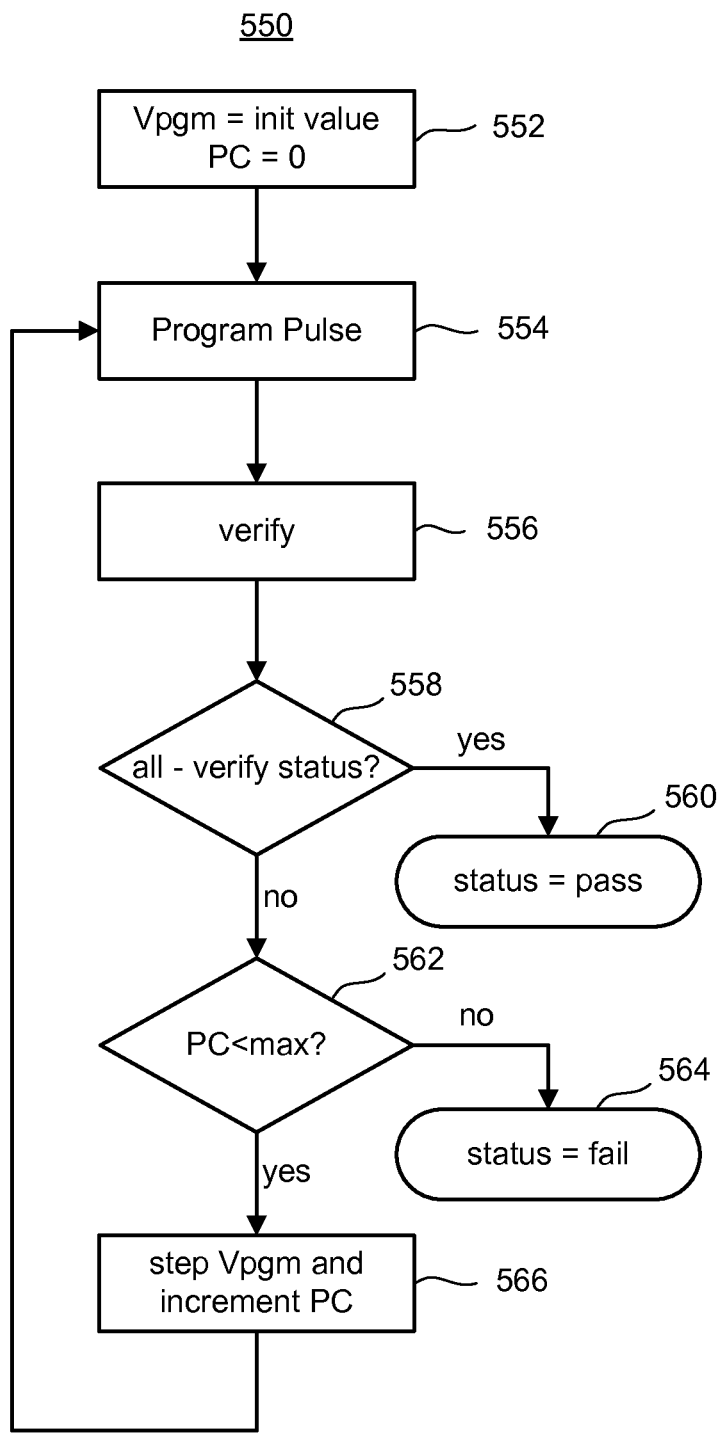
FIG. 5A depicts a flowchart of one embodiment of a programming process.

FIG. 5A is a flowchart describing one embodiment of a programming process 550, which includes one or more verification steps. Any of the programming sequences described herein may be used, as well as other programming sequences. For example, process 550 could be used in an LM sequence, a full programming sequence, a smart verify, etc.

In step 552, the program voltage (Vpgm) is set to an initial value. Also, in step 552, a program counter (PC) is initialized to zero. In step 554, a program pulse is applied to control gates of memory cells. Step 554 may also include establishing programming conditions on bit lines. Bit lines associated with memory cells to receive programming may be provided with a program enable voltage; bit lines associated with memory cells to be prevented from programming may be provided with a program disable voltage.

In step 556, a verification process is performed. In step 558, it is determined whether memory cells have verified that their threshold voltages are at the final target voltage for that memory cell. Note that it is not required that every memory cell for a given state is verified to be at the appropriate threshold voltage. Error correction is able to correct for some memory cells being below their target threshold voltage. Error correction is able to correct for some memory cells being over-programmed. Step 558 is referring to all states having completed programming.

If verification passes, the programming process is completed successfully (status=pass) in step 560. If all of the memory cells are not all verified, then it is determined whether the program counter (PC) is less than a maximum value such as 20. If the program counter (PC) is not less than max (step 562), then the program process has failed (step 564). If the program counter (PC) is less than a maximum value (e.g., 20), then the program counter (PC) is incremented by 1 and the program voltage is stepped up to the next pulse in step 556. Subsequent to step 556, the process loops back to step 554 and the next program pulse is applied to the memory cells.

At the end of a successful programming process (with verification), the threshold voltages of the memory cells should be within one or more distributions of threshold voltages for programmed memory cells or within a distribution of threshold voltages for erased memory cells, as appropriate. FIG. 5B illustrates example $V_T$ distributions corresponding to data states for the memory cell array when each memory cell stores three bits of data. Other embodiment, however, may use more or fewer than three bits of data per memory cell. One axis represents the number of memory cells. This may be a logarithmic scale. The other axis represents threshold voltage ($V_T$) of the memory cells.

FIG. 5B shows eight $V_T$ distributions corresponding to an Erase state and programmed states A-G. In one embodiment, the threshold voltages in the Erase state are negative and the threshold voltages in the programmed states A-G are positive. However, the threshold voltages in one or more of programmed states A-G may be negative. Some or all of the threshold voltages in the Erase state could be positive.

At or near the lower edge of the threshold distribution for each programmed state is a verify reference voltage. For example, FIG. 5B shows VvA for the A-state, VvB for the B-state, VvC for the C-state, VvD for the D-state, VvE for the E-state, VvF for the F-state, and VvG for the G-state. When programming memory cells to a given state, the managing circuit will test whether those memory cells have a threshold voltage greater than or equal to the verify reference voltage.

Between each adjacent pair of the $V_T$ distributions are read reference voltages used for reading data from memory cells. For example, FIG. 5B shows read reference voltage VrA between the erase state and the A-state, VrB between the A-state and B-state, VrC between the B-state and C-state, VrD between the C-state and D-state, VrE between the D-state and E-state, VrF between the E-state and F-state, and VrG between the F-state and G-state. By testing whether the threshold voltage of a given memory cell is above or below the respective read reference voltages, the managing circuit can determine what state the memory cell is in. For example, a memory cell whose threshold voltage is greater than VrD, but less them VrE may be assumed to be in the D-state.

FIG. 5C illustrates that $V_T$ distributions can partially overlap. For example, with respect to read level VrB, some A-state memory cells have a threshold voltage that is greater than VrB. Also, some B-state memory cells have a threshold voltage that is less than VrB. Some amount of overlap is acceptable as an error correction algorithm can handle a certain percentage of cells whose $V_T$ is outside of their intended $V_T$ range.

Note that in some embodiments, just after programming, the threshold voltage distribution may resemble FIG. 5C. However, over time, the threshold voltages of memory cells may shift, such that there may be overlap between $V_T$ distributions. One possible cause of the shift is charge leaking from the charge storage region of memory cells. Another possible cause of the shift is charge unintentionally being added to the charge storage region of memory cells.

On the other hand, in some cases, there may be overlap between $V_T$ distributions immediately after programming. For example, some memory cells may be over-programmed. An example of this is when programming a memory cell to the A-state its threshold voltage may unintentionally go above VrB. It is also possible for under-programming to occur. An example of this is that when programming a memory cell to the B-state its threshold voltage may not quite reach the VrB level. In each case, this does not mean the programming has failed. As noted above, an error correction algorithm can handle a certain percentage of cells whose threshold voltage is not in their intended $V_T$ distribution.

Also note that contrary to the equal spacing/width of the depicted threshold voltage distributions, various distributions may have different widths/spacings in order to accommodate varying amounts of susceptibility to data retention loss, as well as other factors.

Figure 5D:
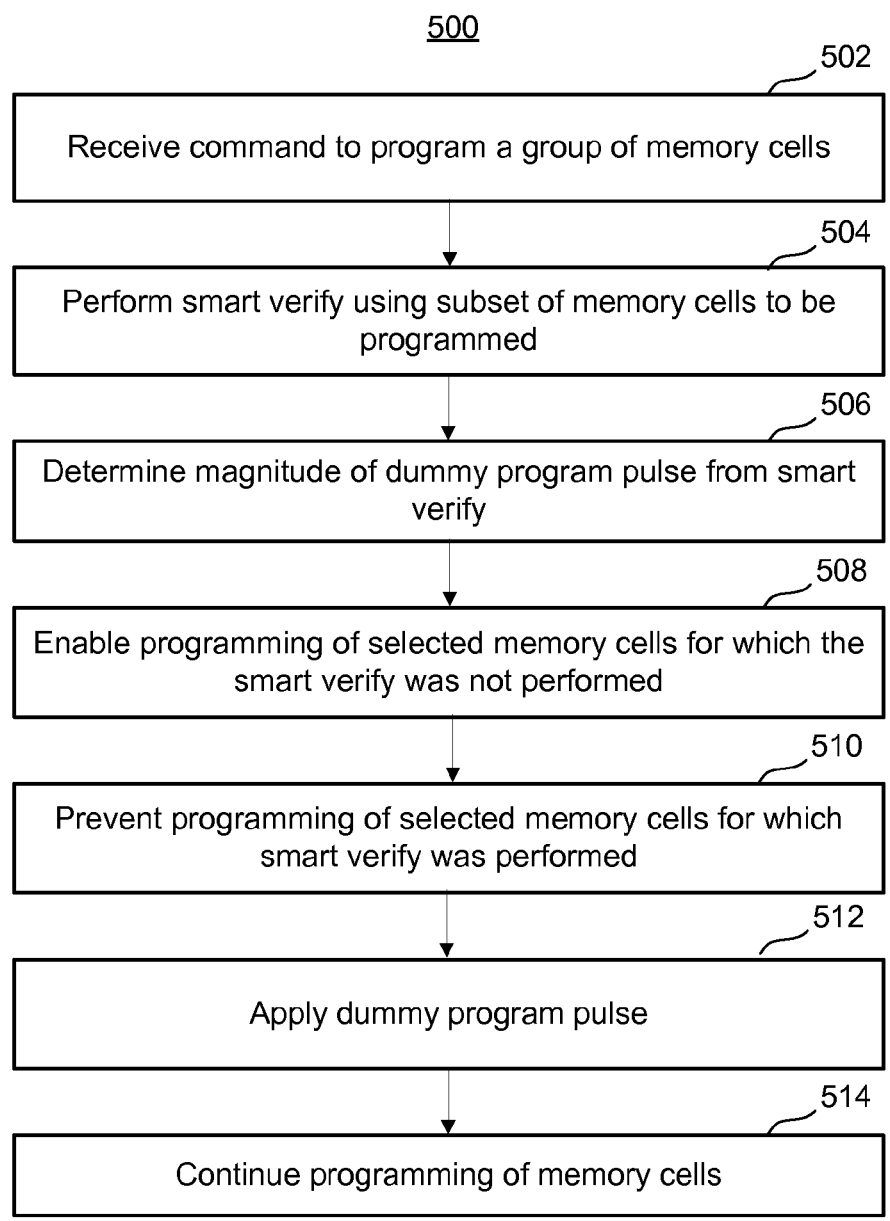
FIG. 5D is a flowchart of one embodiment of a process 500 of programming non-volatile storage elements.

FIG. 5D is a flowchart of one embodiment of a process 500 of programming non-volatile storage elements (e.g., memory cells). Step 502 includes receiving a command to program a group of memory cells. In one embodiment, each memory cell to be programmed is associated with the same word line. In one embodiment, each memory cell to be programmed is associated with a different bit line. In one embodiment, controller 122 sends a command to memory die 108 to program a group of memory cells. The command could be sent to a memory package that contains several memory die. Note that typically the memory cells are erased prior to programming. Thus, note that the group of memory cells may be in an erase state prior to process 500.

Process 500 can be used in a number of programming sequences. One example is referred to as full sequence programming. In full sequence programming, memory cells may be programmed from the erase state to their respective target thresholds during a single phase. One example is referred to as an LM sequence programming. In an LM sequence programming, memory cells whose target thresholds are the highest are first programmed from the erase state to an intermediate level in one phase. Then, memory cells are programmed from either the erase state or the intermediate level to their respective target thresholds during a second phase. There are many other programming sequences that can be used in process 500.

In step 504, a smart verify is performed using a subset of the memory cells to be programmed. One embodiment of the smart verify is discussed below. Briefly, during smart verify, the control circuit selects a subset of the memory cells to receive some amount of programming during the smart verify process. Non-selected memory cells do not receive any programming during smart verify. A variety of techniques can be used to select the memory cells. The smart verify is used to determine how fast the memory cells program, in one embodiment. For example, the smart verify may examine the number of program pulses, as well the magnitude of the program pulses, that are needed to increase the threshold voltage of the memory cells to a target level. Note the some memory cells may program faster than others, so this test may be based on determining when a certain percentage of the memory cells reach the target level, or some other method.

In step 506, a magnitude of a dummy program pulse is determined, based on results of smart verify. Herein, the term "dummy program pulse" refers to a program pulse that is not followed by a program verify to test the efficacy of the dummy program pulse. Of course, a program verify may be performed after later applying a program pulse that is not a dummy program pulse. Step 506 may determine magnitudes for several different dummy program pulses.

Step 508 includes enabling programming of selected memory cells for which the smart verify was not performed. In one embodiment, step 508 includes applying a voltage to bit lines that allows memory cells associated with those bit lines to program. In this step, the selected memory cells do not necessarily include all of the memory cells that are to eventually receive programming in this process. As one example, memory cells that are to be programmed to a data state near a smart verify level (and for which the smart verify was not performed) are selected. As one example, memory cells that are to be programmed to an intermediate state (and for which the smart verify was not performed) are selected. As one example, memory cells that are to be programmed to one particular state (and for which the smart verify was not performed) are selected. As one example, memory cells that are to be programmed to any state (and for which the smart verify was not performed) are selected. Also, some memory cells for which smart verify was performed may be enabled for programming. For example, memory cells that are to be programmed to a state that is significantly above a smart verify level may be enable for programming. Many examples are described herein.

Step 510 includes preventing programming of selected memory cells for which smart verify was performed. In one embodiment, this includes, but is not limited to, memory cells to be programmed to a state near a smart verify level. A reason for this selection is to prevent over-programming of those memory cells that were part of smart verify and are to be programmed to a state near the smart verify reference level. Note that not all memory cells for which smart verify was performed are locked out, in some embodiments. Other memory cells for which smart verify was not performed could also be prevented from programming. For example, memory cells that are to remain in the erase state may be prevented from programming. Also, any memory cell that was not selected in step 508 could be prevented from programming in step 510. In one embodiment, step 510 includes applying a voltage to bit lines that prevents memory cells associated with those bit lines to program.

Step 512 includes applying a dummy program signal (e.g., voltage pulse) to the memory cells in the group. In one embodiment, the dummy program voltage pulse is applied to the word line that is associated with the group of memory cells. In one embodiment, the dummy program pulse is applied to the control gate of each of the memory cells in the group. Step 512 can include applying more than one dummy program pulse to the memory cells. Note that when applying more than one dummy pulse, the memory cells that are enabled and those that are preventing from programming can change.

Step 514 includes continuing to program the memory cells. Step 514 may include applying a program pulse, followed by performing a program verify. This pattern may be repeated until programming of the group of memory cells in complete. Thus, a process similar to the one of FIG. 5A might be used.

Figure 6:
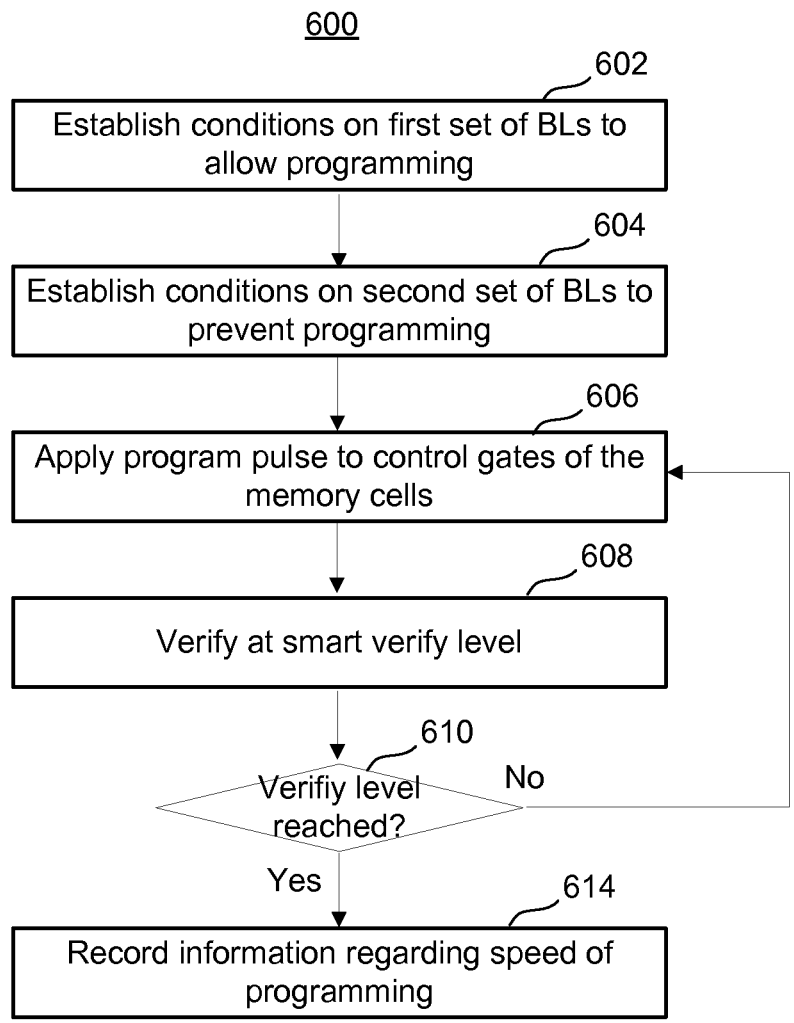
FIG. 6 is a flowchart of one embodiment of a process 600 of performing a smart verify.

FIG. 6 is a flowchart of one embodiment of a process 600 of performing a smart verify. In process 600, information regarding the programming speed of the memory cells is recorded. This information may be used to determine a magnitude of a dummy program pulse. Process 600 is one embodiment of step 504 of process 500. In one embodiment, the smart verify is used when programming memory cells to an intermediate state. This may also be referred to as programming a lower page of data. In this example, the smart verify reference level may be a verify level associated with the intermediate state. In this case, the memory cells involved in smart verify may be those to be programmed to the D-, E-, F-, and G-states. In one embodiment, the smart verify is used during full sequence programming. In this example, the smart verify reference level may be a verify level associated with the lowest data state (e.g., the A-state). Note that the smart verify level might not be exactly at these levels for reasons to be discussed below. In the full sequence example, the memory cells involved in smart verify may include those to be programmed to the A-, B-, C-, D-, E-, F-, and G-states. Note that these are just two examples. Also, the smart verify can be used when the $V_T$ distributions at the end of programming has more or fewer than eight states.

In step 602, conditions are established on a first set of bit lines to allow programming. This first set of bit lines are associated with memory cells that will receive programming during the smart verify. In one embodiment, a program enable voltage is applied to the first set of bit lines. This is a voltage that connects the NAND strings of selected memory cells to the bit line, in one embodiment. Thus, this voltage may turn on a drain side select gate.

In one embodiment, the memory cells in step 602 include a subset of memory cells to be programmed to the D-, E-, F-, and G-states. In one embodiment, the memory cells include a subset of memory cells to be programmed to the A-, B-, C-, D-, E-, F-, and G-states. A different set of data states may be used. Note that selecting just a subset of the memory cells can reduce current consumption significantly.

In step 604, conditions are established on a second set of bit lines to prevent programming. This second set of bit lines are associated with memory cells that will not receive programming during the smart verify. In one embodiment, a program disable voltage is applied to the second set of bit lines. This is a voltage that disconnects the NAND strings of unselected memory cells from the bit line, in one embodiment. Thus, this voltage may turn off a drain side select gate.

In step 606, a program pulse is applied to control gates of the memory cells. In one embodiment, the program pulse is applied to a word line that is associated with the memory cells. Note that in some architectures, the word line is connected to the control gate of all of the memory cells in the group. The program pulse may be applied to control gates of all of the memory cells in the group, since the bit line conditions can prevent programming where it is not desired. However, it is not required that the program pulse be applied to control gates of memory cells that are not part of the smart verify.

In step 608, $V_T$ verification at a smart verify reference level is performed. This may include applying a reference voltage to control gates of the memory cells and sensing the bit lines in response thereto. Note that it is not required that bit lines associated with all memory cells in the group are sensed. Therefore, it is not required to establish sensing voltages on all of the bit lines, which may save current and/or power. Thus, in one embodiment, the control circuit locks out from sensing all memory cells in the group other than the subset that was selected for smart verify. Locking out from sensing may include not pre-charging bit lines to a level that allows sensing. Memory cells to be sensed can have their bit lines pre-charged to a level that allows sensing.

Figure 7A:
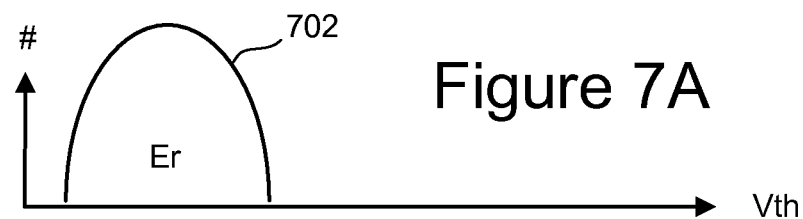
FIG. 7A-7D depict threshold voltage distributions during one embodiment of smart verify.

In step 610, a determination is made whether the smart verify is over. Referring to FIG. 7A, initially all of the memory cells are in the erase state 702. After the first program pulse is applied, the threshold voltages of those memory cells whose bit lines are enabled moves up. This is represented by smart verify distribution 704 in FIG. 7B. The erase distribution 702 now contains fewer memory cells.

In one embodiment, the control circuit determines whether a sufficient number of memory cells have passed the smart verify. Step 610 may test for whether the fastest programming memory cells have reached the smart verify level. Therefore, step 610 may pass even though many slower programming memory cells have not yet reached the smart verify level. Also note that some of the memory cells whose bit lines were enabled might be excluded from the test in step 610. For example, some memory cells might not be representative of typical programming speed, but are included to provide better results for the memory cells that are representative of typical programming speed. As one example, in a 2D NAND, the control circuit might enable (in step 602) memory cells on groups of four neighboring NAND strings. There may be several (or many) NAND strings between each group of four that are not enabled. In this case, the memory cells on the two interior NAND strings in each group of four may be representative of typical programming conditions. Thus, bit lines of the two interior NAND strings may be sensed in step 610. However, those memory cells on the two exterior NAND strings in each group of four might not be representative of typical programming conditions. A reason for this is they have a neighbor that is not subject to programming. Thus, bits lines of the two exterior NAND strings may be excluded from sensing in step 610.

Process 600 then goes to step 606 to apply another program pulse to the control gates of the memory cells, assuming smart verify has not yet passed. This program pulse may have the same characteristics of the previous, or the characteristics may change. For example, the program pulse may have the same magnitude as the previous, or the magnitude may increase. Another possibility is to alter the duration of the program pulse. For example, the program pulse could be longer as the process progressed. A combination of magnitude and duration changes may be used.

Figure 7B:
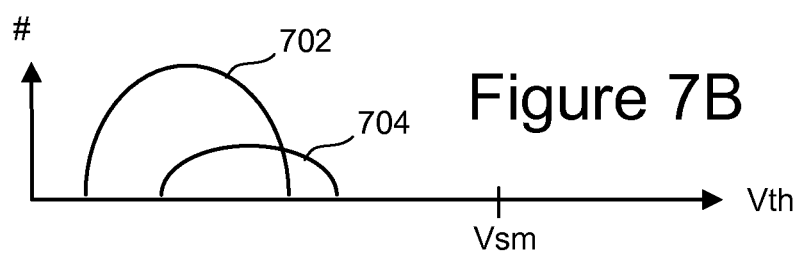
Figure 7C:
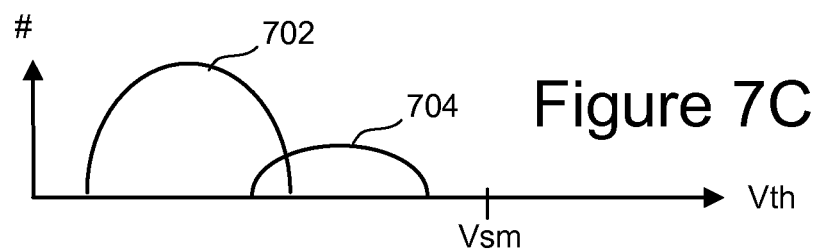
Figure 7D:
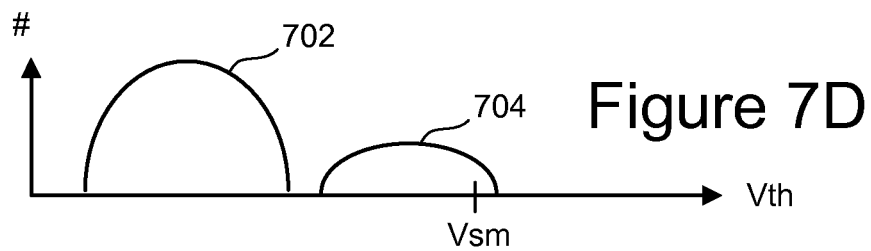

FIGS. 7B-7D depict results after each additional program pulse is applied. After the smart verify level (Vsm) has been reached (step 610=yes), information regarding the smart verify is recorded, in step 614. Note that in FIG. 7D, smart verify passes when the fastest programming memory cells have reached the smart verify level (Vsm). In one embodiment, the number of program pulses that were applied to reach the smart verify level is recorded. In one embodiment, program pulse magnitude information is recorded. For example, the magnitude of the final program pulse might be recorded in an embodiment in which the magnitude changes during the process. In one embodiment, the control circuit determines a suitable magnitude for an initial program pulse based on the smart verify results. Thus, the recorded information might be a voltage magnitude for a dummy program pulse. The information can be a number such as one, two, three . . . , which identifies a number of program loops used to program the fastest memory cells an initial amount, magnitude of program voltage used to program the fastest memory cells an initial amount, etc. Note that process 600 is one embodiment that can be used to determine how fast memory cells program, but other techniques may be used.

The recorded information can be stored external to the memory array 126, such as in code/parameters 113. Or, the information can be stored external to the memory die 108. An advantage to storing the information in the nonvolatile memory cells of the memory array is that the information will not be lost if there is a power outage in the memory device or if the information is overwritten when programming another block. In contrast, a data register typically uses a volatile memory such as RAM in which data can be lost in a power outage. Another advantage to storing the information in the nonvolatile memory cells is that it is less expensive than RAM.

Figure 8:
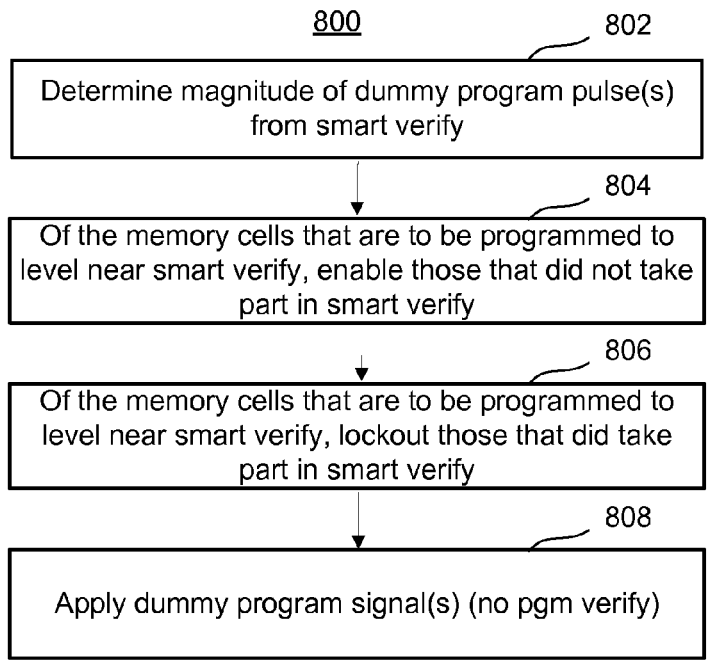
FIG. 8 is a flowchart of one embodiment of a process 800 of programming memory cells using an LM sequence.

FIG. 8 is a flowchart of one embodiment of a process 800 of programming memory cells using an LM sequence. Process 800 is used in an LM sequence that involves an intermediate (IM) state, in one embodiment. Process 800 is one embodiment of steps 506-512 of process 500. Thus, note that a smart verify of a subset of the memory cells may be performed prior to process 800.

In step 802, a magnitude for one or more dummy program pulses is determined based on results from the smart verify. In one embodiment, a magnitude is suitable to raise threshold voltages from the erase state to near the D-state, without over programming past the D-state. This may be conservative to avoid over programming. Similarly, magnitudes that are suitable to raise threshold voltages from the erase state to near the E-, F-, or G-states, again without over programming the respective states may be determined. Instead of going from the erase state directly to the E-state, programming could go from erase state to near the D-state, and then to the E-state. Many other examples are possible. Further details are discussed below.

In step 804, of the memory cells to be programmed to a level near the smart verify level, enable for programming those that did not take part in smart verify. In one embodiment, the D-state is near the smart verify level. Hence, of those memory cells to be programmed to the D-state, those that did not take part in smart verify may be enabled in step 804. However, instead the threshold level of some other state could be deemed to be near the smart verify level. A data state may be defined as being near the smart verify level based the verify levels. As one example, if the smart verify level is within one state below the given state, then it is deemed near. For example, if the smart verify level is between VvC and VvD, then it is deemed near the D-state. However, the smart verify level could be slightly above the state and still deemed near. Note that other memory cells may also be enabled in step 804. For example, memory cells to be programmed to a data state above the D-state might be enabled for programming. More generally, memory cells to be programmed to a data state above the aforementioned state near the smart verify level may be enabled.

In step 806, of the memory cells to be programmed to a level near the smart verify level, lockout for programming those that did take part in smart verify. Note that other memory cells may also be locked out in step 806.

In step 808, one or more dummy program pulses are applied to control gates of the memory cells. Note that there is not a program verify to test results of the dummy program pulse. Also note that when more than one dummy program pulse is applied, the memory cells that are enabled for programming and those locked out can change. Also note that when more than one dummy pulse is applied, the magnitude of the dummy pulses may be different from one another, depending on how much movement of $V_T$ is desired. This is further explained with respect to FIGS. 10 and 11.

Figure 9:
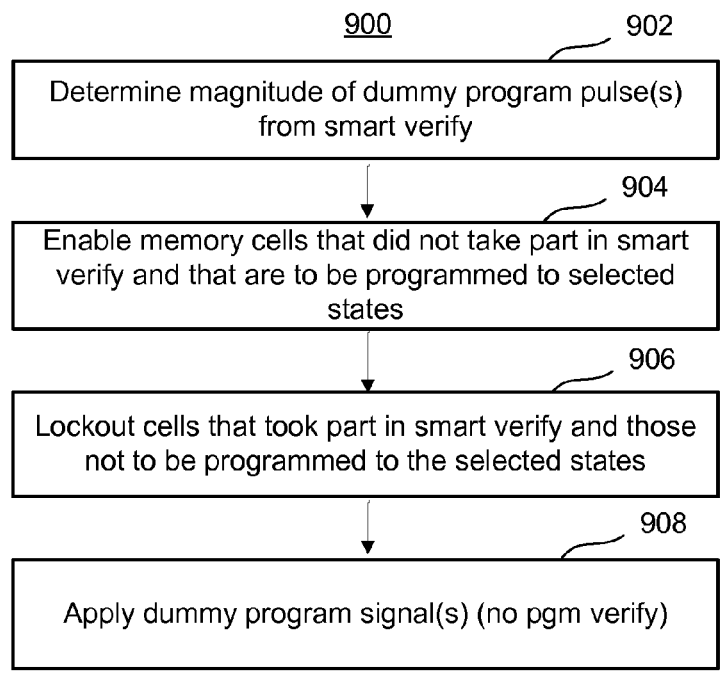
FIG. 9 is a flowchart of one embodiment of a process 900 of programming memory cells using full sequence.

FIG. 9 is a flowchart of one embodiment of a process 900 of programming memory cells using full sequence. Process 900 is one embodiment of steps 506-512 of process 500. Thus, note that a smart verify of a subset of the memory cells may be performed prior to process 900.

In step 902, a magnitude for one or more dummy program pulses is determined based on results from the smart verify. In one embodiment, a suitable dummy program pulse is determined for different states. For example, if the memory cells are to be programmed to an A-state through a G-state, a suitable dummy program pulse can be determined for programming from the erase state to the A-state, erase state directly to B-state, etc. Another possibility is to provide a dummy pulse that has a target from the erase to A-state, then a dummy from the foregoing resulting distribution to the B-state, etc. Further details are discussed below.

In step 904, memory cells that did not take part in the smart verify and that are to be programmed to a selected set of the states are enabled for programming. For example, memory cells to be programmed to the A-state through the G-state can be enabled. A smaller set of the data states might be selected. It may be desirable to select those to be programmed to the higher threshold voltage states, as there can be a greater current savings in the overall programming process to dummy program the higher threshold voltage states. The term "dummy program" refers to applying one or more dummy program pulses to a memory cell that is enabled for programming.

In step 906, memory cells that were not selected in step 904 are locked out from programming. These memory cells may include those that took part in smart verify, as well as those that did not take part in smart verify but were not selected in step 904.

In step 908, one or more dummy program pulses are applied to control gates of the memory cells. Again, note that there is not a program verify to test results of the dummy program pulse. Also note that when more than one dummy program pulse is applied, the memory cells that are enabled for programming and those locked out can change between dummy pulses. This is further explained with respect to FIGS. 13 and 14.

Figure 10A:
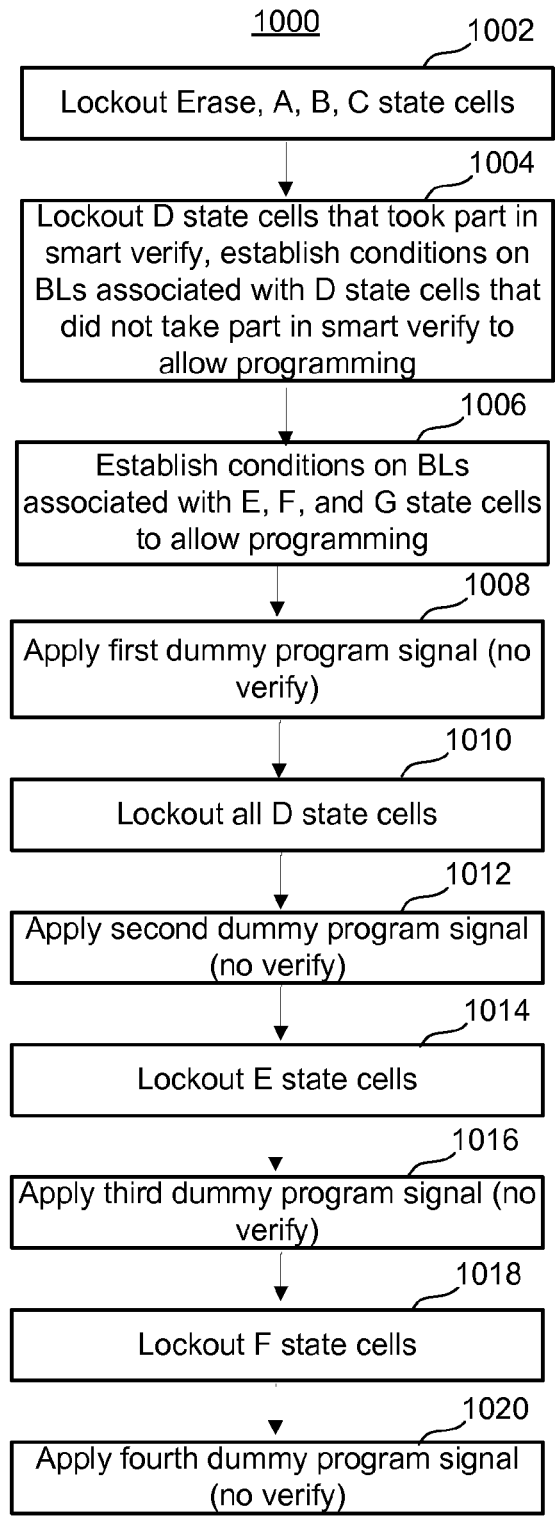
FIG. 10A is a flowchart of one embodiment of a process 1000 of applying dummy pulses during an IM programming sequence.

FIG. 10A is a flowchart of one embodiment of a process 1000 of applying dummy pulses during an IM programming sequence. Process 1000 is one embodiment of steps 804-808 of process 800. Thus, the smart verify may be performed prior to process 1000. FIG. 10B depicts $V_T$ distributions prior to one embodiment of process 1000. Also depicted are example verify reference levels VvA, VvB, VvC, VvD, VvE, VvF, and VvG. There is an erase distribution 702 and a smart verify distribution 1050. In this embodiment, the smart verify distribution 1050 was programmed such that the fastest programming memory cells are at or below the verify level for the D-state (VvD). The smart verify distribution 1050 could be programmed to a higher or lower $V_T$. A reason keeping the smart verify level lower is that the $V_T$ of the memory cells can shift upwards when a neighboring memory cell is programmed. By establishing the smart verify level below VvD, over programming of D-state memory cells can be prevented. However, note that these effects are dependent on the architecture, and it may not always be necessary to have the smart verify level below VvD. In another embodiment, the smart verify distribution 1050 is programmed to a verify level associated with an intermediate data state (e.g., $V_{LM}$). In another embodiment, the smart verify distribution 1050 is programmed to a level somewhat below VLM for reasons just discussed. Other verify levels may be used for the smart verify distribution 1050. For convenience of explanation, process 1000 will be discussed using the example smart verify distribution 1050 depicted in FIG. 10B.

Also, note that magnitudes for the dummy program pulses may have already been determined in step 802 of process 800. Process 1000 is for an embodiment that has eight data states. Process 1000 can be modified to accommodate fewer or more data states. In process 1000, it will be assumed that all of the memory cells are associated with the same word line.

In step 1002, memory cells to stay in the erase state, and those to be programmed to the A-, B-, and C-state are locked out. In step 1004, of the memory cells to be programmed to the D-state, those that took part in the smart verify are locked out. Also, D-state memory cells that did not take part in smart verify are enabled for programming. Note that those memory cells are represented by the smart verify distribution 1050 in FIG. 10B. Steps 1002-1004 are expressed this way for convenience of explanation. Another way of saying this is that all memory cells that took part in the smart verify are locked out and that all those to be programmed to the A-, B-, and C-state are also locked out.

In step 1006, the memory cells to be programmed to the E-, F-, and G-state are enabled for programming. Enabling for programming may be accomplished by establishing conditions of the associated bit lines that enable programming.

In step 1008, a first dummy program pulse is applied to the word line associated with the group of memory cells. FIG. 10C depicts one example of $V_T$ distributions after step 1008. Distribution 1052 pertains to the memory cells that are to be programmed to the D-, E-, F-, or G-state and were not involved in the smart verify. The magnitude of the dummy pulse was selected to attempt to get the threshold voltages near the verify level VvD for the D-state, in this example. Distribution 1052 may be fairly wide due to the differing program speeds of individual memory cells. That is, some memory cells may have their $V_T$ shift by significantly more than others. The magnitude of the dummy pulse was determined based on how fast the memory cells programmed during smart verify, in one embodiment. In this example, some of the memory cells could have a $V_T$ above VvD, but this is not required. Thus, distribution 1052 could be lower. On the other hand, distribution 1052 could be higher. If memory cells have their $V_T$ go above VvE, then they may be over-programmed (for D-state cells). Thus, it may be beneficial to avoid having a significant portion of distribution 1052 go above VvE. This may be accomplished by being fairly conservative with the dummy program pulse. Also, as mentioned above, for some memory architectures, the $V_T$ of a memory cell can appear to increase as a result of capacitive coupling to a neighbor that is later programmed. This effect may be considered when establishing a suitable magnitude for the dummy program pulse. Distribution 1050 it now represents only the D-state cells that took part in smart verify. Distribution 1051 represents E-, F-, and G-state cells that took part in smart verify.

In step 1010, D-state memory cells are locked out from further programming. In step 1012, a second dummy program pulse is applied to the word line associated with the group of memory cells. FIG. 10D depicts one example of $V_T$ distributions after step 1012. Distribution 1054 pertains to the memory cells that are to be programmed to the E-, F-, or G-state. This includes both those that were previously in distribution 1051 and 1052. Thus, some of the E-, F-, or G-state cells are programmed from distribution 1051 to 1054. Others are programmed from distribution 1052 to 1054. The magnitude of the dummy pulse may be selected to attempt to get the threshold voltages near the verify level VvE for the E-state. The magnitude is determined based on how fast the memory cells programmed during smart verify, in one embodiment. In this example, some of the memory cells have a $V_T$ above VvE, but this is not required. Thus, distribution 1054 could be lower or higher.

Distribution 1053 represents the D-state cells from distributions 1050 and 1052. That is, distribution 1053 represents all of the D-state cells. Note that distribution 1053 from FIG. 10C has shrunk relative to distribution 1052 in FIG. 10D.

In step 1014, E-state memory cells are locked out from further programming. In step 1016, a third dummy program pulse is applied to the word line associated with the group of memory cells. FIG. 10E depicts one example of $V_T$ distributions after step 1016. Distribution 1056 pertains to the memory cells that are to be programmed to the F-, or G-state. The magnitude of the dummy pulse was selected to attempt to get the threshold voltages near the verify level VvF for the F-state. The magnitude was determined based on how fast the memory cells programmed during smart verify, in one embodiment. In this example, some of the memory cells have a $V_T$ above VvF, but this is not required. Thus, distribution 1056 could be lower or higher. Note that distribution 1054 from FIG. 10D has shrunk to distribution 1054 in FIG. 10E, due to distribution 1054 now including just E-state memory cells.

In step 1018, F-state memory cells are locked out from further programming. In step 1020, a fourth dummy program pulse is applied to the word line associated with the group of memory cells. FIG. 10F depicts one example of $V_T$ distributions after step 1020. Distribution 1058 includes the memory cells that are to be programmed to the G-state. The magnitude of the dummy pulse was selected to attempt to get the threshold voltages near the verify level VvG for the G-state. The magnitude was determined based on how fast the memory cells programmed during smart verify, in one embodiment. In this example, some of the memory cells have a $V_T$ above VvG, but this is not required. Thus, distribution 1058 could be lower or higher. Note that distribution 1056 from FIG. 10E has shrunk to distribution 1056 in FIG. 10F.

The result in FIG. 10F is that most of the $V_T$ of memory cells to be programmed to the E-, F-, and G-states has been raised above VvD. This can save current when programming to an intermediate state, as will be explained below. However, prior to that explanation, another embodiment that can result in $V_T$ distributions similar to FIG. 10F will be discussed.

Figure 11A:
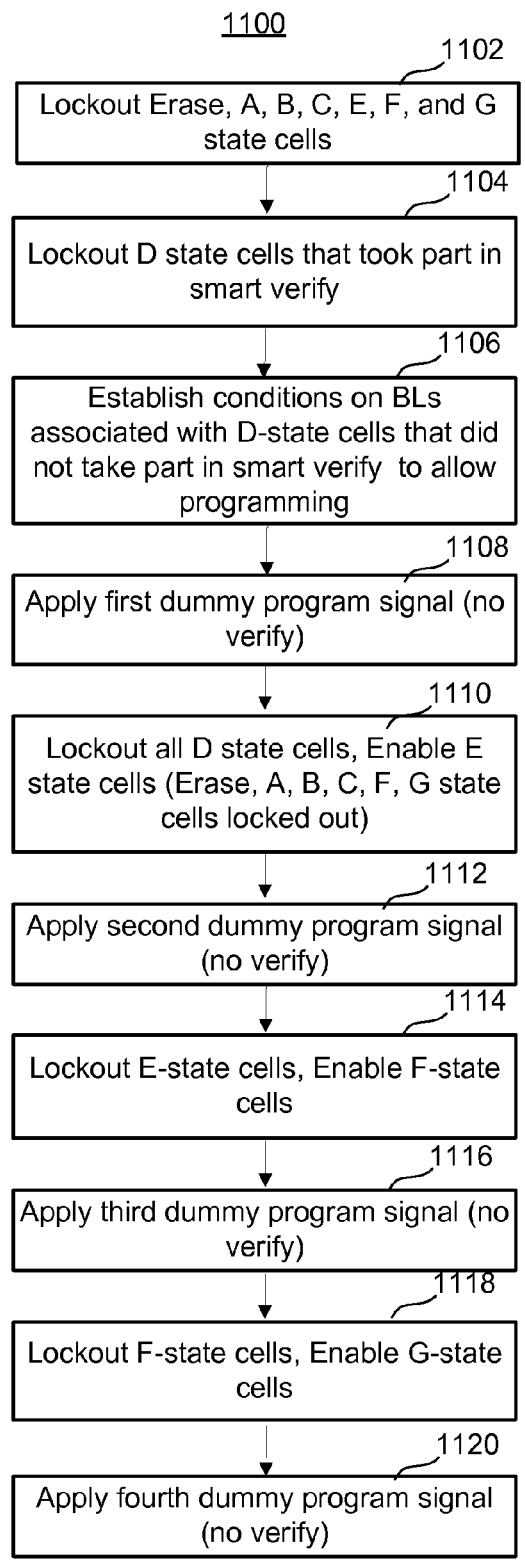
FIG. 11A is a flowchart of another embodiment of a process 1100 of applying dummy pulses during an IM programming sequence.

FIG. 11A is a flowchart of another embodiment of a process 1100 of applying dummy pulses during an IM programming sequence. Process 1100 is one embodiment of steps 804-808 of process 800. Thus, the smart verify may be performed prior to process 1100. Thus, the $V_T$ distributions in FIG. 10B are also applicable to the conditions prior to one embodiment of process 1100. Also, magnitudes for the dummy program pulses for process 1100 may have already been determined in step 802 of process 800. Process 1100 is for an embodiment that has eight data states. The process 1100 can be modified to accommodate fewer or more data states. In process 1100, it will be assumed that all of the memory cells are associated with the same word line.

In step 1102, memory cells to stay in the erase state, and those to be programmed to the A-, B-, C-, E-, F-, and G-state are locked out. In step 1104, of the memory cells to be programmed to the D-state, those that took part in the smart verify are locked out. Steps 1002-1004 are expressed this way for convenience of explanation. Another way of saying this is that all memory cells that took part in the smart verify are locked out and that all those to be programmed to the A-, B-, C-, E-, F-, and G-state, as well as those to stay erased, are also locked out.

In step 1106, of the memory cells to be programmed to the D-state, those that did not take part in the smart verify are enabled for programming. Enabling for programming may be accomplished by establishing conditions of the associated bit lines that enable programming.

In step 1108, a first dummy program pulse is applied to the word line associated with the group of memory cells. FIG. 11B depicts one example of $V_T$ distributions after step 1108. Distribution 1152 pertains to the memory cells that are to be programmed to the D-state and were not involved in the smart verify. The magnitude of the dummy pulse was selected to attempt to get the threshold voltages near the verify level VvD for the D-state. The magnitude of the dummy pulse determined based on how fast the memory cells programmed during smart verify, in one embodiment. In this example, some of the memory cells have a $V_T$ above VvD, but this is not required. Thus, distribution 1152 could be lower or higher. Distribution 1150 refers to D-, E-, F-, and G-state memory cells that were included in smart verify.

In step 1110, all D-state memory cells are locked out. Also, E-state memory cells are enabled for programming. Those to stay in the erase state, and those to be programmed to the A-, B-, C-, F-, and G-state remain locked out.

In step 1112, a second dummy program pulse is applied to the word line associated with the group of memory cells. FIG. 11C depicts one example of $V_T$ distributions after step 1112. Distribution 1154 pertains to the memory cells that are to be programmed to the E-state. Some of these memory cells came from smart verify distribution 1150 (in FIG. 11B), others from the erase distribution 702. Distribution 1151 includes D-, F-, and G-state memory cells that were in smart verify. The magnitude of the dummy pulse was selected to attempt to get the threshold voltages near the verify level VvE for the E-state. The magnitude was determined based on how fast the memory cells programmed during smart verify, in one embodiment. In this example, some of the memory cells have a $V_T$ above VvE, but this is not required. Thus, distribution 1154 could be lower or higher.

In step 1114, all E-state memory cells are locked out. Also, F-state memory cells are enabled for programming. Those to stay in the erase state, and those to be programmed to the A-, B-, C-, D-, and G-state remain locked out.

In step 1116, a third dummy program pulse is applied to the word line associated with the group of memory cells. FIG. 11D depicts one example of $V_T$ distributions after step 1112. Distribution 1156 pertains to the memory cells that are to be programmed to the F-state. Some of these memory cells came from the erase distribution 702, others came from distribution 1151. Distribution 1155 includes the D- and G-state cells that took part in smart verify (previously in distribution 1151). The magnitude of the dummy pulse was selected to attempt to get the threshold voltages near the verify level VvF for the F-state. The magnitude was determined based on how fast the memory cells programmed during smart verify, in one embodiment. In this example, some of the memory cells have a $V_T$ above VvF, but this is not required. Thus, distribution 1156 could be lower or higher.

In step 1118, all F-state memory cells are locked out. Also, G-state memory cells are enabled for programming. Those to stay in the erase state, and those to be programmed to the A-, B-, C-, D-, and E-state remain locked out.

In step 1120, a fourth dummy program pulse is applied to the word line associated with the group of memory cells. FIG. 11E depicts one example of $V_T$ distributions after step 1120. Distribution 1158 pertains to the memory cells that are to be programmed to the G-state. Some of the cells came from the erase distribution 702, others came from distribution 1155. FIG. 1155 is not depicted in FIG. 11E. Distribution 1159 represents all D-state cells (including those formerly in distributions 1155 and 1152). The magnitude of the dummy pulse was selected to attempt to get the threshold voltages near the verify level VvG for the G-state. The magnitude was determined based on how fast the memory cells programmed during smart verify, in one embodiment. In this example, some of the memory cells have a $V_T$ above VvG, but this is not required. Thus, distribution 1158 could be lower or higher.

Note that results in FIG. 11E after process 1100 may be similar to the results in FIG. 10F after process 1000. Other variations are possible. For example, after the results in FIG. 10C in which D-, E-, F-, and G-state cells are in distribution 1052, a dummy pulse could be used to push E-state cells near the VvE, F-state cells near VvF (using one dummy pulse), and G-state cells near VvG (using one dummy pulse).

Figure 12A:
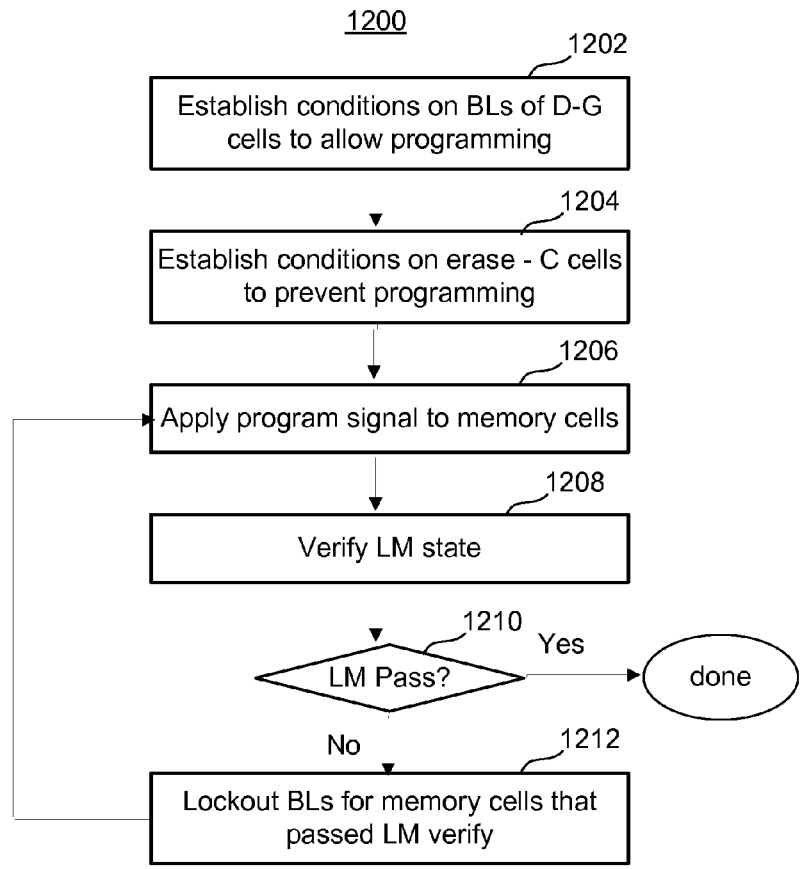
FIG. 12A is a flowchart of one embodiment of a process 1200 of programming memory cells to an LM state.

FIG. 12A is a flowchart of one embodiment of a process 1200 of programming memory cells to an LM state. Process 1200 may be used to after process 1000 or 1100 was performed. In step 1202, conditions are established on bit lines to allow programming of memory cells to be programmed to the D-, E-, F-, and G-states. In step 1204, conditions are established on bit lines to prevent programming of memory cells that are to stay in the erase state, as well as those to be programmed to the A-, B-, and C-states.

In step 1206, a program voltage is applied to the word line. In step 1208, a program verify operation is performed. In step 1210, a determination is made whether the LM programming is over. This step may test for whether a sufficient number of the memory cells have a $V_T$ greater than the LM state. If not, then the process continues at step 1212. In step 1212, memory cells that have passed the LM verify are locked out. Process 1200 then continues at step 1206. After step 1210 indicates the LM state programming is finished the process ends.

Figure 12B:
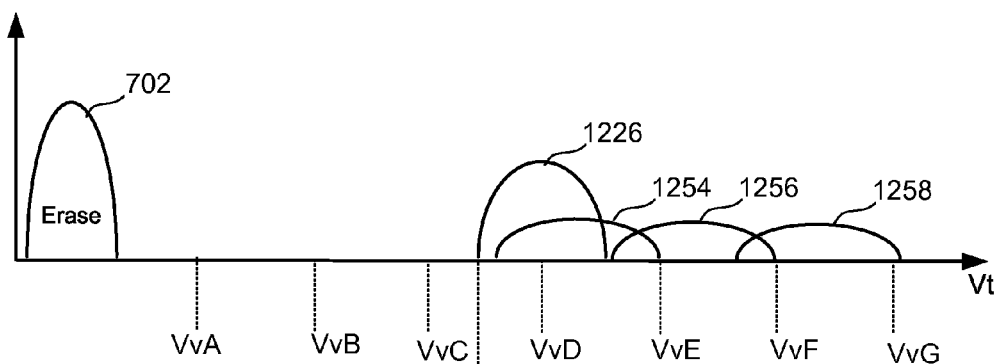
FIG. 12B depicts results after one embodiment of process 1200.

FIG. 12B depicts results after process 1200. The LM distribution 1226 is shown just above the LM verify level (VLM). Distribution 1254 refers to the memory cells that were in distribution 1054 in FIG. 10F. Note that some of the memory cells that were in distribution 1054 in FIG. 10F may have received some programming and are now depicted in being part of LM distribution 1226. Similar reasons may apply to distributions 1056 and 1058 in FIG. 10F. However, it is possible that a distribution in FIG. 10F was so high up that no memory cells received any programming during process 1200. Distribution 1052 from FIG. 10F does not have a corresponding distribution in FIG. 12B. For the sake of discussion it is assumed that all memory cells from distribution 1052 are now in LM distribution 1226.

Also note that some of the memory cells that were in smart verify distribution 1050 are now in LM distribution 1226. That is, memory cells that are to be programmed to the D-, E-, F-, and G-states and that did take part in smart verify are programmed from distribution 1050 to LM distribution 1226.

The above discussion compared $V_T$ distributions of FIG. 10F with FIG. 12B. Similar reasoning applies to $V_T$ distributions 1152, 1154, 1156 and 1158 in FIG. 11E.

Note that considerable current is saved in process 1200 for at least the following reasons. Many of the memory cells in distributions 1054, 1056, and 1058 in FIG. 10F can be locked out early in process. Thus, the total BL capacitance which needs to be pre-charged during programming process is reduced. This can save a considerable amount of current when establishing programming conditions. Also, during program verify in process 1200, since their $V_T$ will be above the LM verify level they will not conduct a current. Therefore additional current is saved during program verify.

After process 1200, the LM programming sequence may be finished by programming all of the memory cells to their final states. This may include programming memory cells from LM distribution 1226 to either the D-, E-, F, or G-state; programming memory cells from distribution 1254 to the E-state; programming memory cells from distribution 1256 to the F-state; and programming memory cells from distribution 1258 to the G-state. Also, some of the memory cells in the erase state 702 are programmed to the A-, B, or C-state. The foregoing programming could occur in a single phase or multiple phases.

Figure 13A:
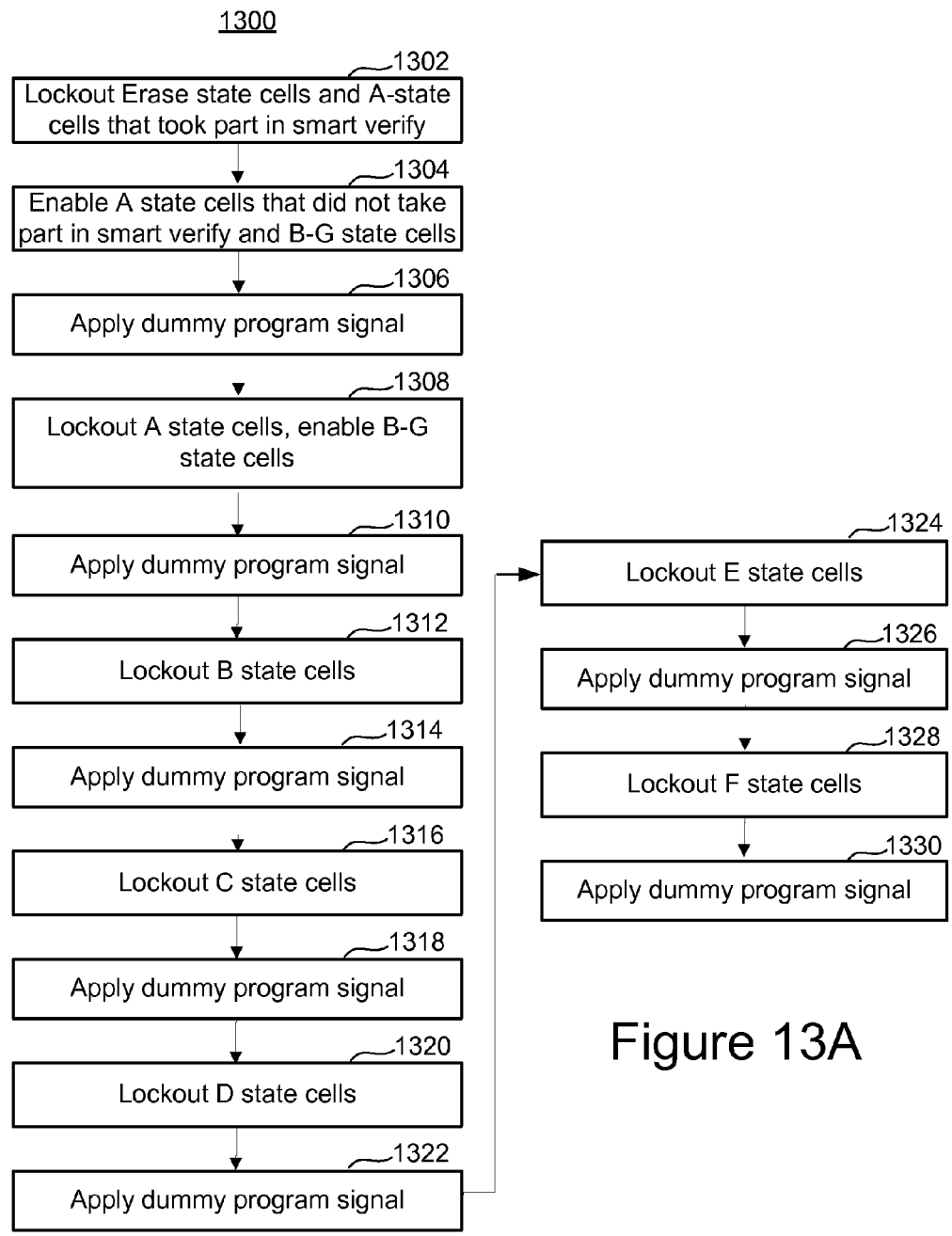
FIG. 13A is a flowchart of one embodiment of a process 1300 of programming using a full sequence.

FIG. 13A is a flowchart of one embodiment of a process 1300 of programming using a full sequence. Process 1300 is one embodiment of steps 904-908 of process 900. Thus, the smart verify may be performed prior to process 1300. Note that the smart verify level can be different from the one used in processes 1000 and 1100. One possible smart verify level for process 1300 is at the A-state verify level (VvA). However, as noted above, the smart verify level can be somewhat below the A-state verify level (VvA) to account for possible apparent $V_T$ shift of memory cells due to later programming of a neighbor. As noted, this effect could depend on the memory architecture.

Also, magnitudes for the dummy program pulses for process 1300 may have already been determined in step 902 of process 900. Process 1300 is for an embodiment that has eight data states. The process 1300 can be modified to accommodate fewer or more data states. In process 1300, it will be assumed that all of the memory cells are associated with the same word line.

Figure 13B:
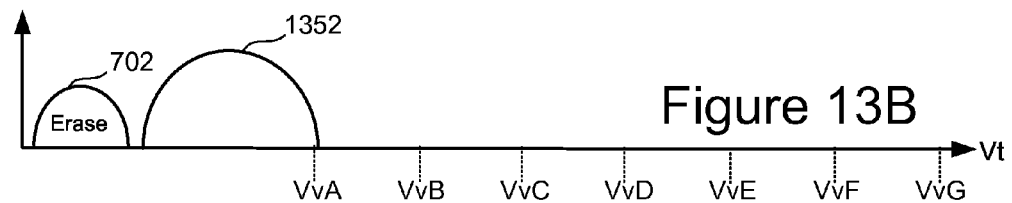
FIGS. 13B-13H depicts $V_T$ distributions during one embodiment of process 1300 of FIG. 13A.

In step 1302, the memory cells to stay in the erase state are locked out. A state memory cells that went through smart verify may also be locked out. In step 1304, the memory cells to be programmed to the B- through G-states are enabled for programming. Also, A-state cells that did not take part in smart verify are enabled. In step 1306, a dummy programming pulse is applied to the word line. The magnitude of this dummy pulse may be determined based on the smart verify. FIG. 13B depicts results after one embodiment of step 1306. FIG. 13B depicts an erase distribution 702 and distribution 1352. Distribution 1352 includes those memory cells programmed from the erase state 702. Distribution 1352 may also include memory cells programmed during smart verify. Thus, for convenience of explanation, a smart verify distribution is not depicted in FIG. 13B.

Figure 13C:
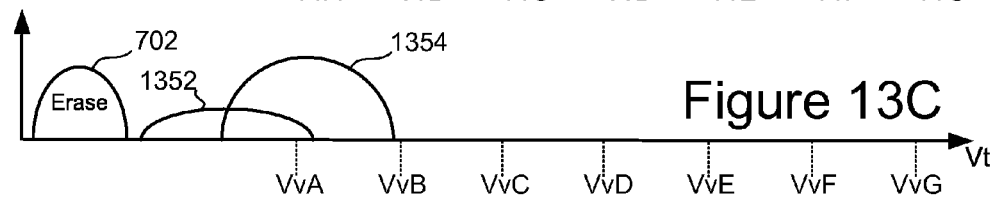

In step 1308, the memory cells to be programmed to the A-state are locked out. The memory cells to stay in the erase state remain locked out. The memory cells to be programmed to the B- through G-state remain enabled for programming. In step 1310, a dummy programming pulse is applied to the word line. The magnitude of this dummy pulse may be determined based on the smart verify. FIG. 13C depicts results after one embodiment of step 1310. FIG. 13C depicts distribution 1354, which represents the memory cells of B- through G-states that were programmed from distribution 1352. Distribution 1352 now contains just the A-state memory cells.

Figure 13D:
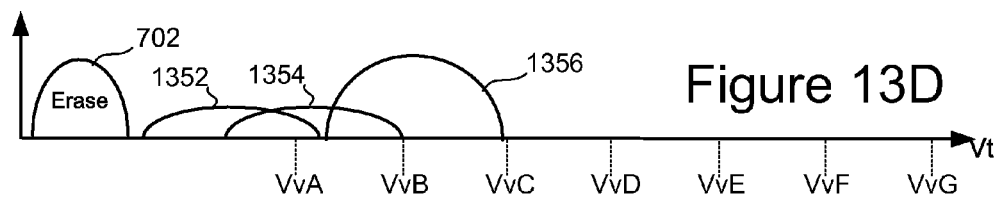

In step 1312, the memory cells to be programmed to the B-state are locked out. Other memory cells remain in their previous condition. In step 1314, a dummy programming pulse is applied to the word line. The magnitude of this dummy pulse may be determined based on the smart verify. FIG. 13D depicts results after one embodiment of step 1314. FIG. 13D depicts distribution 1356, which represents the memory cells of C- through G-states that were programmed from distribution 1354. Distribution 1354 now contains just the B-state memory cells.

Figure 13E:
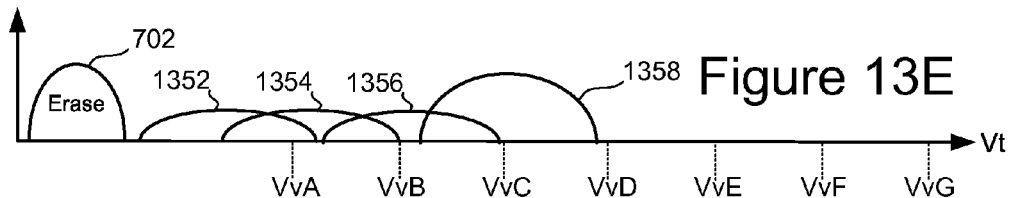

In step 1316, the memory cells to be programmed to the C-state are locked out. Other memory cells remain in their previous condition. In step 1318, a dummy programming pulse is applied to the word line. The magnitude of this dummy pulse may be determined based on the smart verify. FIG. 13E depicts results after one embodiment of step 1318. FIG. 13E depicts distribution 1358, which represents the memory cells of D- through G-states that were programmed from distribution 1356. Distribution 1356 now contains just the C-state memory cells.

Figure 13F:
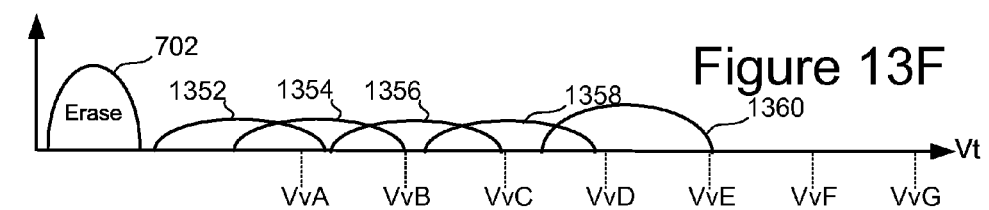

In step 1320, the memory cells to be programmed to the D-state are locked out. Other memory cells remain in their previous condition. In step 1322, a dummy programming pulse is applied to the word line. The magnitude of this dummy pulse may be determined based on the smart verify. FIG. 13F depicts results after one embodiment of step 1322. FIG. 13F depicts distribution 1360, which represents the memory cells of E- through G-states that were programmed from distribution 1358. Distribution 1358 now contains just the D-state memory cells.

Figure 13G:
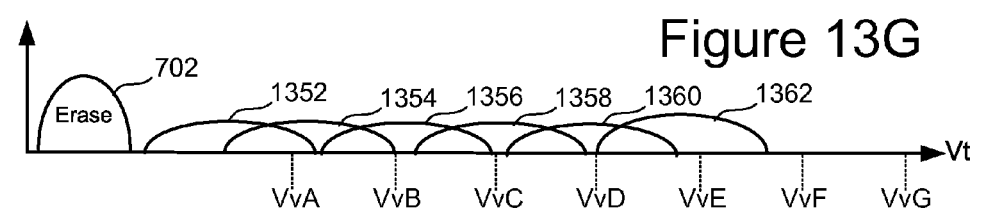

In step 1324, the memory cells to be programmed to the E-state are locked out. Other memory cells remain in their previous condition. In step 1326, a dummy programming pulse is applied to the word line. The magnitude of this dummy pulse may be determined based on the smart verify. FIG. 13G depicts results after one embodiment of step 1318. FIG. 13G depicts distribution 1362, which represents the memory cells of F- through G-states that were programmed from distribution 1360. Distribution 1360 now contains just the E-state memory cells.

Figure 13H:
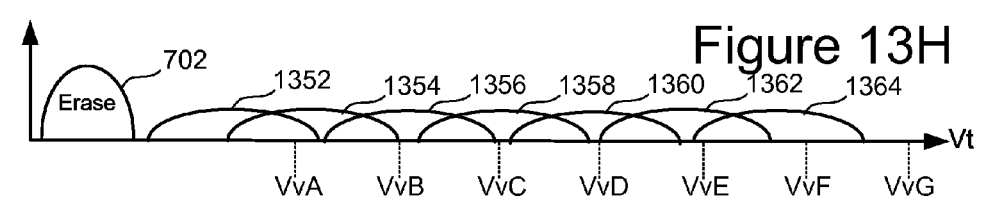

In step 1328, the memory cells to be programmed to the F-state are locked out. Other memory cells remain in their previous condition. In step 1330, a dummy programming pulse is applied to the word line. The magnitude of this dummy pulse may be determined based on the smart verify. FIG. 13H depicts results after one embodiment of step 1330. FIG. 13H depicts distribution 1364, which represents the memory cells of the G-state that were programmed from distribution 1362. Distribution 1360 now contains just the F-state memory cells.

Figure 14A:
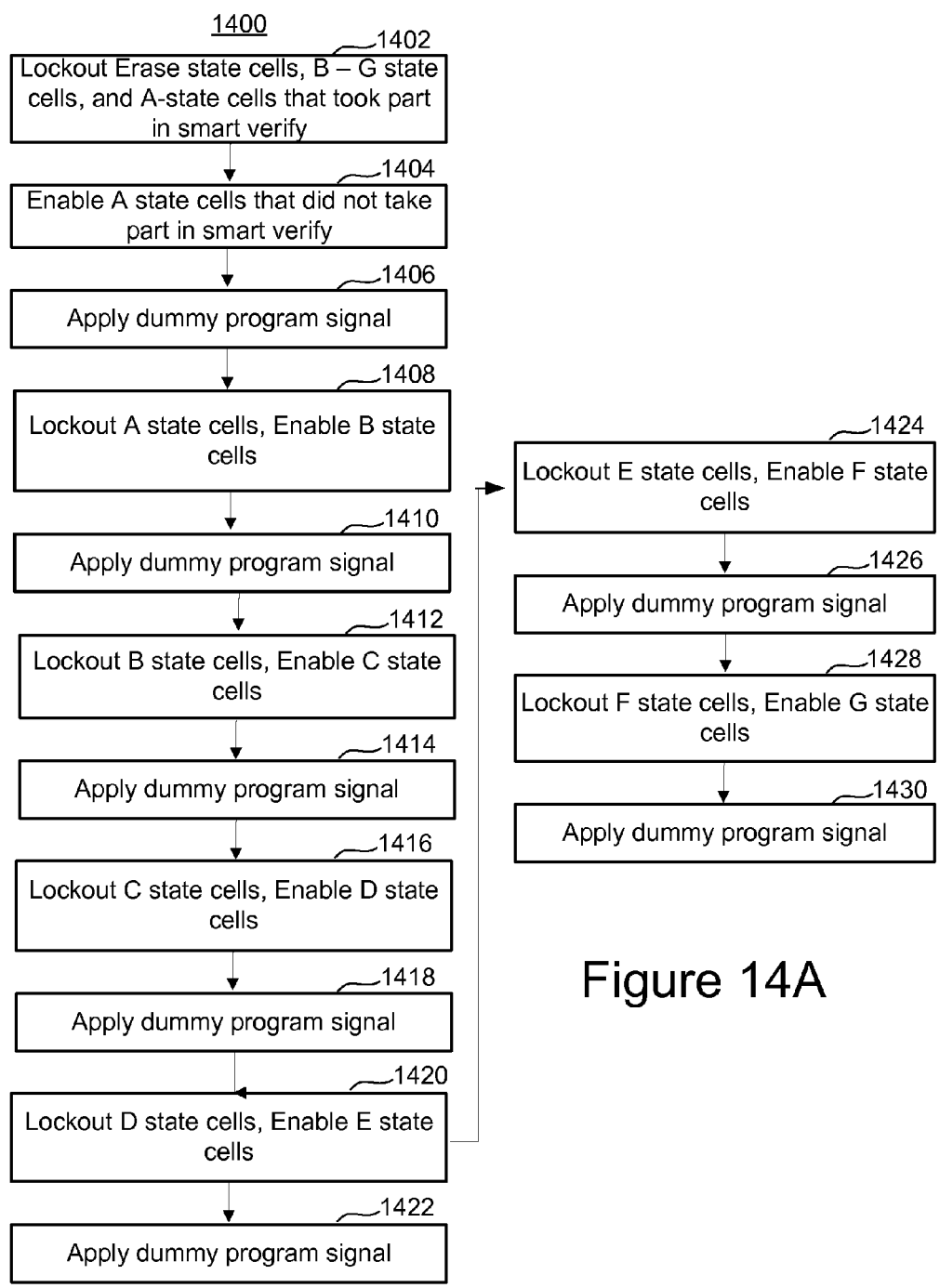
FIG. 14A is a flowchart of one embodiment of a process 1400 of programming using a full sequence.

FIG. 14A is a flowchart of one embodiment of a process 1400 of programming using a full sequence. In process 1400 the dummy program pulse pushes the $V_T$ directly from the erase state to near their intended program state. Process 1400 is one embodiment of steps 904-908 of process 900. Thus, the smart verify may be performed prior to process 1400. In one embodiment, the smart verify level is at the AvV level, or somewhat below the AvV level. Magnitudes for the dummy program pulses for process 1400 may have already been determined in step 902 of process 900. Process 1400 is for an embodiment that has eight data states. The process 1400 can be modified to accommodate fewer or more data states. In process 1400, it will be assumed that all of the memory cells are associated with the same word line.

Figure 14B:
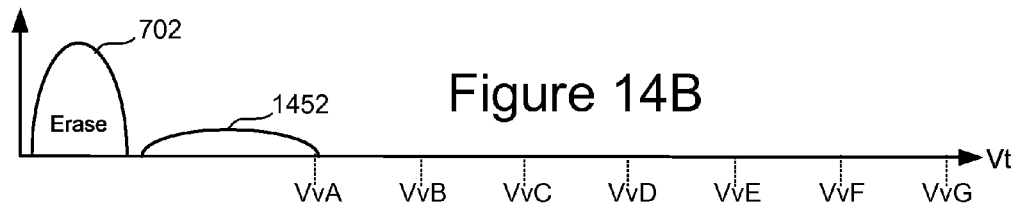
FIGS. 14B-14H depicts $V_T$ distributions during one embodiment of process 1400 of FIG. 14A.

In step 1402, the memory cells to stay in the erase state and B- though G-states are locked out. Also, the A-state memory cells that took part in smart verify may be locked out. In step 1404, the memory cells to be programmed to the A-state that did not take part in smart verify are enabled for programming. In step 1406, a dummy programming pulse is applied to the word line. The magnitude of this dummy pulse may be determined based on the smart verify. FIG. 14B depicts results after one embodiment of step 1406. FIG. 14B depicts an erase distribution 702 and distribution 1452. Distribution 1452 includes the A-state memory cells programmed from the erase state 702. Distribution 1452 may also include A- through G-state memory cells programmed during the smart verify.

Figure 14C:
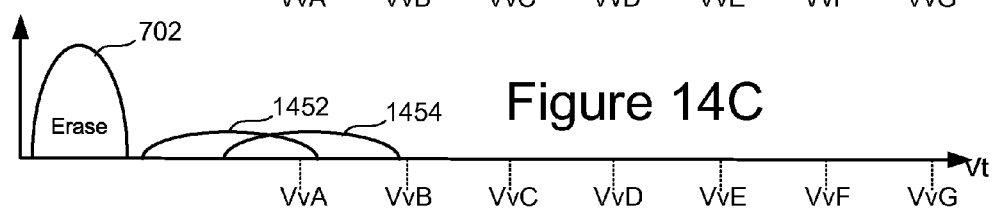

In step 1408, the memory cells to be programmed to the A-state are locked out. The memory cells to be programmed to the B-state are enabled for programming. Other memory cells remain locked out. In step 1410, a dummy programming pulse is applied to the word line. The magnitude of this dummy pulse may be determined based on the smart verify. FIG. 14C depicts results after one embodiment of step 1410. FIG. 14C depicts distribution 1454, which represents the memory cells of the B-state that were programmed from the erase state 702.

Figure 14D:
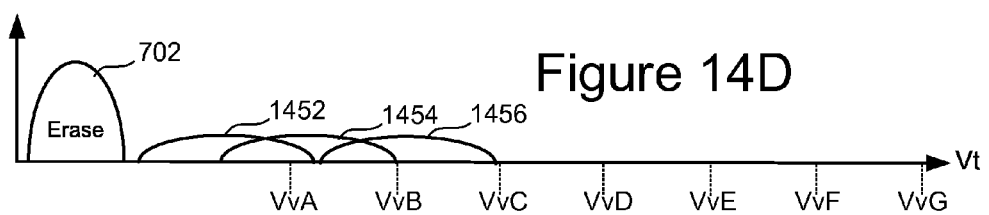

In step 1412, the memory cells to be programmed to the B-state are locked out. The memory cells to be programmed to the C-state are enabled for programming. Other memory cells remain locked out. In step 1414, a dummy programming pulse is applied to the word line. The magnitude of this dummy pulse may be determined based on the smart verify. FIG. 14D depicts results after one embodiment of step 1414. FIG. 14D depicts distribution 1456, which represents the memory cells of the C-state that were programmed from the erase state 702.

Figure 14E:
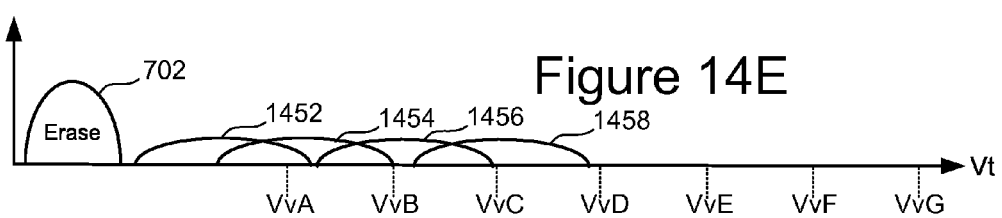

In step 1416, the memory cells to be programmed to the C-state are locked out. The memory cells to be programmed to the D-state are enabled for programming. Other memory cells remain locked out. In step 1418, a dummy programming pulse is applied to the word line. The magnitude of this dummy pulse may be determined based on the smart verify. FIG. 14E depicts results after one embodiment of step 1418. FIG. 14E depicts distribution 1458, which represents the memory cells of the D-state that were programmed from the erase state 702.

Figure 14F:
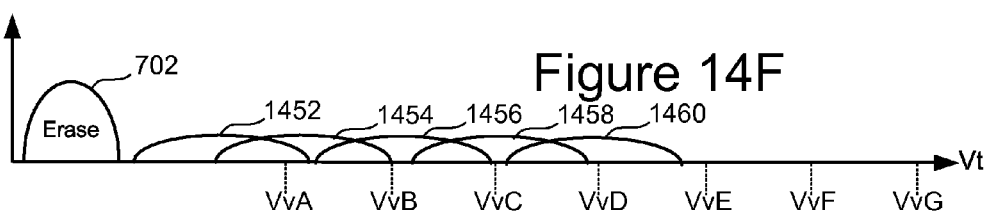

In step 1420, the memory cells to be programmed to the D-state are locked out. The memory cells to be programmed to the E-state are enabled for programming. Other memory cells remain locked out. In step 1422, a dummy programming pulse is applied to the word line. The magnitude of this dummy pulse may be determined based on the smart verify. FIG. 14F depicts results after one embodiment of step 1422. FIG. 14F depicts distribution 1460, which represents the memory cells of the E-state that were programmed from the erase state 702.

Figure 14G:
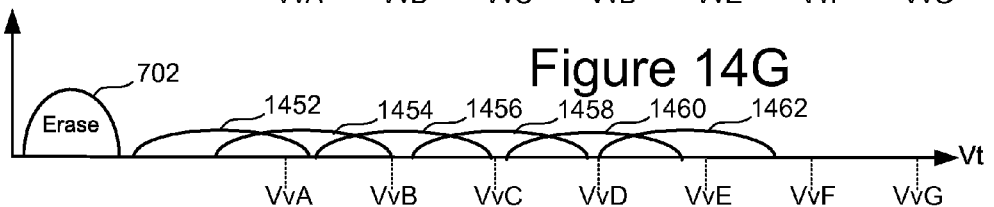

In step 1424, the memory cells to be programmed to the E-state are locked out. The memory cells to be programmed to the F-state are enabled for programming. Other memory cells remain locked out. In step 1426, a dummy programming pulse is applied to the word line. The magnitude of this dummy pulse may be determined based on the smart verify. FIG. 14G depicts results after one embodiment of step 1426. FIG. 14G depicts distribution 1462, which represents the memory cells of the F-state that were programmed from the erase state 702.

Figure 14H:
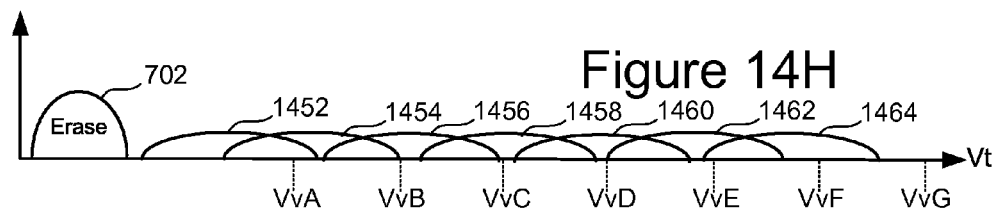

In step 1428, the memory cells to be programmed to the F-state are locked out. The memory cells to be programmed to the G-state are enabled for programming. Other memory cells remain locked out. In step 1430, a dummy programming pulse is applied to the word line. The magnitude of this dummy pulse may be determined based on the smart verify. FIG. 14H depicts results after one embodiment of step 1430. FIG. 14H depicts distribution 1464, which represents the memory cells of the G-state that were programmed from the erase state 702.

Figure 15:
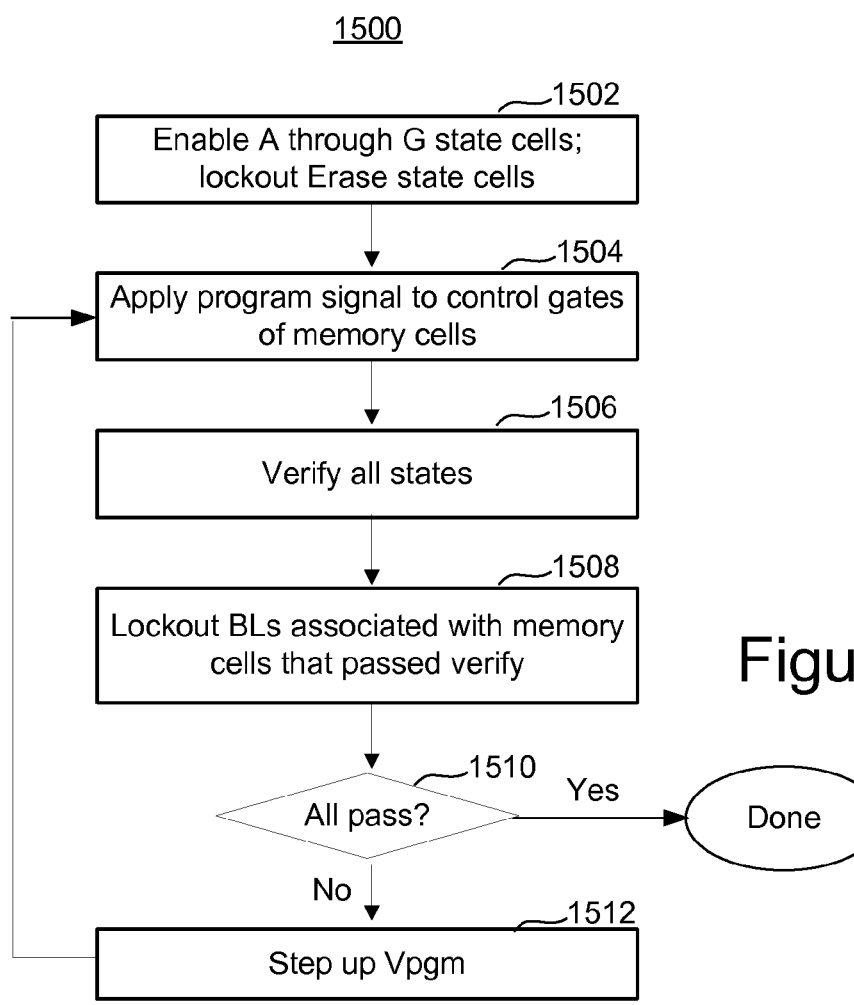
FIG. 15 is a flowchart of one embodiment of a process 1500 of finishing a full sequence programming.

FIG. 15 is a flowchart of a process 1500 of finishing a full sequence programming. This process may be performed after process 1300 or 1400. Process 1500 may start with the $V_T$ distributions looking like the examples in FIG. 13H or 14H, but is not limited to those examples. A goal of one embodiment of process 1500 is to tighten up the $V_T$ distributions. In step 1502, memory cells to be programmed to the A- through G-states are enabled for programming. Erase state memory cells may be locked out. In one embodiment, information regarding the $V_T$ of memory cells during smart verify is maintained such that some of the A- through G-state memory cells can be locked out to prevent possible over-programming.

In step 1504, a program voltage is applied to the word line associated with the memory cells. In step 1506, program verify is performed at the various levels (e.g., VvA, VvB, VvC, VvD, VvE, VvE, VvF, VvG). In step 1508, memory cells that passed verify for their respective state are locked out from further programming. In step 1510, a determination is made whether programming is done. This test may be based on no more than a certain number of memory cells failing program verify. The program voltage (Vpgm) is stepped up in step 1512, if programming is not done. Process 1500 returns to step 1504 if programming is not complete.

Note that current consumption may be reduced considerably during process 1500. Because many of the memory cells have such a high $V_T$ early in process 1500, they will not conduct a current when verifying at many of the verify reference level. This is in contrast with a conventional process. Also recall that process 1300 and 1400 applied dummy pulses. Thus, current was not used during a program verify in those processes 1300, 1400.

Figure 16:
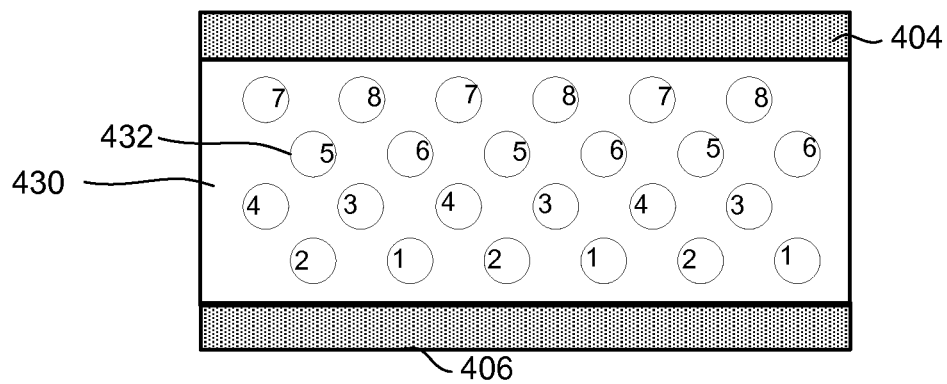
FIG. 16 is a diagram to illustrate one embodiment of selecting memory cells for smart verify.

FIG. 16 is a diagram of portion of FIG. 4A. The region between local interconnect 404 and 406 is depicted. FIG. 16 illustrates one technique for selecting memory cells to take part in a smart verify. The memory cells are numbered 1-8. This numbering may pertain to how they are addressed. Memory cells labeled 1, 2, 7, or 8 are closer to the local interconnects 404, 406. These will be referred to as "outer memory cells". Memory cells labeled 3, 4, 5, or 6, are further from the local interconnects. These may be referred to as "inner memory cells." The programming characteristics (e.g., speed) of inner memory cells may different from outer memory cells.

In one embodiment, memory cells are selected for smart verify based on whether they are inner or outer memory cells. For example, inner memory cells could be selected for smart verify, with outer memory cells not selected. Alternatively, outer memory cells could be selected for smart verify with inner memory cells not selected. A possible reason for this is to select faster programming memory cells for smart verify. Selecting faster programming cells can be useful to assure that the dummy pulse(s) derived from smart verify is/are not too high in magnitude. Other reasons might be used to select inner versus outer memory cells. Also, selecting the inner or outer memory cells is one example of selecting memory cells for smart verify based on their physical location. In this example, it is based on the distance from the memory cell to the local interconnect 404, 406. There can be other configurations in which the physical location of the memory cell impact programming speed. The concept of selecting memory cells that program faster for smart verify can be extended to other physical conditions.

One embodiment disclosed herein includes a non-volatile storage device comprising a plurality of non-volatile storage elements and a control circuit in communication with the non-volatile storage elements. The control circuit is configured to receive a command to program a group of the plurality of non-volatile storage elements and to enable for programming a subset of the group of non-volatile storage elements and disable for programming remaining storage elements in the group. The control circuit is configured to perform a smart verify on the subset of non-volatile storage elements and to determine a magnitude for a dummy programming pulse based on the smart verify. The control circuit is configured to enable programming of selected non-volatile storage elements in the group for which the smart verify was not performed. The control circuit is configured to prevent programming of selected non-volatile storage elements in the group for which the smart verify was performed. The control circuit is configured to apply the dummy programming pulse to the group of non-volatile storage elements while the selected non-volatile storage elements in the group for which the smart verify was not performed are enabled for programming and while the selected non-volatile storage elements in the group for which smart verify was performed are prevented from programming. The control circuit is configured to program the group of non-volatile storage elements after the dummy programming pulse is applied to the group.

One embodiment disclosed herein includes a method of operating non-volatile storage. The method comprises receiving a command to program a group of non-volatile storage elements, enabling for programming a subset of the group of non-volatile storage elements and disabling for programming remaining storage elements in the group, performing a smart verify on the subset of non-volatile storage elements. Based on the smart verify, a magnitude for a dummy programming pulse is determined. The method also includes enabling for programming selected non-volatile storage elements in the group for which the smart verify was not performed, locking out for programming selected non-volatile storage elements in the group for which the smart verify was performed, and applying the dummy programming pulse to the group of non-volatile storage elements while enabling for programming selected non-volatile storage elements in the group for which the smart verify was not performed and while locking out for programming the selected non-volatile storage elements in the group for which the smart verify was performed. The method further includes programming the group of non-volatile storage elements after the dummy programming pulse is applied.

One embodiment includes a 3D stacked non-volatile memory device, comprising a substrate, a three-dimensional memory array that resides above the substrate, and a control circuit in communication with the non-volatile storage element. The three-dimensional memory array comprises a plurality of non-volatile storage elements each comprising a control gate. The control circuit receives a command to program a group of the plurality of non-volatile storage elements, applies signals to the control gates of the group of non-volatile storage elements while a first set of non-volatile storage elements in the group are enabled for programming and a second set of non-volatile storage elements in the group are locked out from programming. The control circuit senses the first set of non-volatile storage elements in response to the applied signals, determines programming characteristics based on the applied signals and the sensing of the first set of non-volatile storage elements, and determines a magnitude for a dummy programming pulse based on the programming characteristics. The control circuit enables programming of selected non-volatile storage elements in the second set, prevents programming of selected non-volatile storage elements in the first set, and applies the dummy programming pulse to the control gates of the group of the non-volatile storage elements while the selected non-volatile storage elements in the second set are enabled for programming and while the selected non-volatile storage elements in the first set are prevented from programming. The control circuit programs the group of non-volatile storage elements after the dummy programming pulse is applied.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage device, comprising:
   a plurality of non-volatile storage elements;
   a control circuit in communication with the non-volatile storage elements, wherein the control circuit is configured to:
   receive a command to program a group of the plurality of non-volatile storage elements;
   characterize a programming speed of the group by applying a programming signal to the group while a subset of the group is enabled for programming and remaining members of the group are inhibited from programming;
   based on the programming speed, determine a magnitude for one or more dummy programming pulses;
   apply the one or more dummy programming pulses to the group while selected ones of the remaining members of the group are enabled for programming and while the subset is inhibited from programming; and
   program the group of non-volatile storage elements after the one or more dummy programming pulses is applied to the group.

2. The non-volatile storage device of claim 1, wherein the control circuit being configured to characterize the programming speed of the group further comprises the control circuit being configured to:
   sense the non-volatile storage elements in the subset after applying the programming signal while locking out from sensing the remaining members of the group.

3. The non-volatile storage device of claim 1, wherein the selected ones of the remaining members of the group that are enabled for programming while the control circuit applies the one or more dummy programming pulses to the group are to be programmed to a threshold voltage that exceeds a target threshold voltage of one or more other members of the group.

4. The non-volatile storage device of claim 1, wherein the control circuit is configured to not verify the non-volatile storage elements in response to applying the one or more dummy programming pulses.

5. The non-volatile storage device of claim 1, wherein the selected ones of the remaining members of the group that are enabled for programming while the control circuit applies the one or more dummy programming pulses to the group are to be programmed from an erase state to an intermediate state.

6. The non-volatile storage device of claim 1, wherein selected ones of the remaining members of the group that are enabled for programming while the control circuit applies the one or more dummy programming pulses to the group are to be programmed from an erase state to any of a plurality of data states.

7. The non-volatile storage device of claim 1, further comprising a three-dimensional memory array that comprises a plurality of word line layers, wherein the group of non-volatile storage elements reside in the same word line layer.

8. The non-volatile storage device of claim 7, wherein non-volatile storage elements in the group are different distances from a local interconnect, wherein the subset is selected for characterizing the programming speed of the group based on distance from the local interconnect.

9. A method of operating non-volatile storage, the method comprising:
   receiving a command to program a group of non-volatile storage elements;
   enabling for programming a subset of the group of non-volatile storage elements and disabling for programming remaining storage elements in the group;
   performing a smart verify on the subset of non-volatile storage elements;
   based on the smart verify, determining a magnitude for a dummy programming pulse;
   enabling for programming selected non-volatile storage elements in the group for which the smart verify was not performed;
   locking out for programming selected non-volatile storage elements in the group for which the smart verify was performed;
   applying the dummy programming pulse to the group of non-volatile storage elements while enabling for programming selected non-volatile storage elements in the group for which the smart verify was not performed and while locking out for programming the selected non-volatile storage elements in the group for which the smart verify was performed; and
   programming the group of non-volatile storage elements after the dummy programming pulse is applied.

10. The method of claim 9, wherein the performing a smart verify on the subset of non-volatile storage elements comprises:
   locking out from programming all non-volatile storage elements in the group other than the subset;
   enabling for programming non-volatile storage elements in the subset that are to be programmed from an erase state to a data state;
   applying a programming signal to control gates of the group of non-volatile storage elements; and
   sensing the non-volatile storage elements in the subset.

11. The method of claim 10, wherein the sensing the non-volatile storage elements in the subset comprises:
- locking out from sensing all non-volatile storage elements in the group other than the subset; and
- enabling for sensing non-volatile storage elements in the subset that are to be programmed from the erase state to a data state.

12. The method of claim 9, further comprising selecting the subset based on physical location of the non-volatile storage elements in the group.

13. The method of claim 9, wherein the enabling for programming selected non-volatile storage elements in the group for which the smart verify was not performed comprises:
- enabling for programming non-volatile storage elements that did not take part in the smart verify and are to be programmed to a first data state near a reference level for the smart verify.

14. The method of claim 13, further comprising enabling for programming non-volatile storage elements that did take part in the smart verify and are to be programmed to a second data state above the first data state.

15. The method of claim 14, wherein the determining a magnitude for a dummy programming pulse comprises:
- determining a magnitude for a dummy programming pulse to change a threshold voltage directly from an erase state to close to, but not above, the second data state.

16. The method of claim 14, wherein the determining a magnitude for a dummy programming pulse comprises:
- determining a magnitude for a dummy programming pulse to change a threshold voltage directly from the first data state to close to, but not above, the second data state.

17. The method of claim 9, wherein the group of non-volatile storage elements reside in the same word line layer of a three-dimensional memory structure.

18. A non-volatile storage device, comprising:
- a word line;
- a plurality of non-volatile storage elements connected to the word line; and
- a control circuit in communication with the word line, wherein the control circuit is configured to:
  - receive a command to program storage elements of the word line;
  - characterize a programming speed of the storage elements by programming only a subset of the storage elements;
  - based on the programming speed, determine a magnitude for a dummy programming pulse;
  - apply the dummy programming pulse to the word line such that one or more storage elements that are not members of the subset receive the dummy programming pulse; and
  - program the storage elements of the word line after applying the dummy programming pulse.

19. The non-volatile storage device of claim 18, wherein the control circuit is configured to program the storage elements to $2^n$ states which range from a lowest to a highest threshold voltage distribution, wherein the one or more storage elements that receive the dummy programming pulse are programmed to one or more of the $2^n$ states with the highest threshold voltage distributions.

20. The non-volatile storage device of claim 18, wherein the programming speed comprises a measure of an amount by which threshold voltages of the subset shift in response to the programming.

* * * * *